(12) United States Patent
Lowrance et al.

(10) Patent No.: US 7,577,487 B2
(45) Date of Patent: Aug. 18, 2009

(54) METHODS AND APPARATUS FOR A BAND TO BAND TRANSFER MODULE

(75) Inventors: Robert B. Lowrance, Los Gatos, CA (US); Eric Andrew Englhardt, Palo Alto, CA (US); Michael R. Rice, Pleasanton, CA (US); Vinay Shah, San Francisco, CA (US); Sushant S. Koshti, Sunnyvale, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 197 days.

(21) Appl. No.: 11/521,070

(22) Filed: Sep. 13, 2006

(65) Prior Publication Data
US 2007/0061031 A1 Mar. 15, 2007

Related U.S. Application Data

(60) Provisional application No. 60/717,335, filed on Sep. 14, 2005, provisional application No. 60/717,150, filed on Sep. 14, 2005, provisional application No. 60/717,336, filed on Sep. 14, 2005.

(51) Int. Cl.
*G06F 19/00* (2006.01)
*G06F 7/00* (2006.01)
(52) U.S. Cl. ............... 700/112; 700/99; 700/121; 700/217; 700/228; 414/935; 414/940
(58) Field of Classification Search ............... 700/95, 700/96, 99–102, 112, 115, 121, 213, 214, 700/217, 228, 230; 414/935, 937, 940, 941
See application file for complete search history.

(56) References Cited

U.S. PATENT DOCUMENTS

| | | | |
|---|---|---|---|
| 3,845,286 A * | 10/1974 | Aronstein et al. | ........... 700/102 |
| 3,868,009 A | 2/1975 | Billi et al. | |
| 4,033,448 A | 7/1977 | MacFarlane et al. | |
| 4,049,500 A | 9/1977 | Kamm | |
| 4,084,684 A | 4/1978 | Skinner, II | |
| 4,143,751 A | 3/1979 | Foster et al. | |
| 4,624,617 A | 11/1986 | Belna | |

(Continued)

FOREIGN PATENT DOCUMENTS

EP 0 552 756 A1 7/1993

(Continued)

OTHER PUBLICATIONS

9613/PCT ISR and WO (PCT/US06/035652) dated Mar. 23, 2007.

(Continued)

*Primary Examiner*—Sean P Shechtman
(74) *Attorney, Agent, or Firm*—Dugan & Dugan

(57) ABSTRACT

A band to band transfer module according to the present invention may be used with a substrate carrier transport system, or other systems, to transfer substrate carriers (e.g., small lot substrate carriers) from one conveyor to another conveyor or between two points on the same conveyor. The transfers (e.g., pick and place) of the substrate carriers may be made between conveyors traveling at different speeds. Numerous other aspects and features are disclosed.

21 Claims, 16 Drawing Sheets

U.S. PATENT DOCUMENTS

| | | | |
|---|---|---|---|
| 4,775,281 A | 10/1988 | Prentakis | |
| 4,825,111 A | 4/1989 | Hommes et al. | |
| 4,841,869 A | 6/1989 | Takeuchi et al. | |
| 4,951,601 A | 8/1990 | Maydan et al. | |
| 4,986,715 A | 1/1991 | Asakawa | |
| 5,096,043 A | 3/1992 | Gorrieri et al. | |
| 5,111,750 A | 5/1992 | Nozaki et al. | |
| 5,180,048 A | 1/1993 | Kawada et al. | |
| 5,203,445 A | 4/1993 | Shiraiwa | |
| 5,242,045 A | 9/1993 | Kakida et al. | |
| 5,267,173 A | 11/1993 | Tanizawa et al. | |
| 5,363,867 A | 11/1994 | Kawano et al. | |
| 5,372,241 A | 12/1994 | Matsumoto | |
| 5,387,265 A | 2/1995 | Kakizaki et al. | |
| 5,388,945 A | 2/1995 | Garric et al. | |
| 5,443,346 A | 8/1995 | Murata et al. | |
| 5,460,478 A | 10/1995 | Akimoto et al. | |
| 5,464,313 A | 11/1995 | Ohsawa | |
| 5,466,109 A | 11/1995 | Iizuka | |
| 5,562,383 A | 10/1996 | Iwai et al. | |
| 5,593,072 A | 1/1997 | Hester et al. | |
| 5,628,604 A | 5/1997 | Murata et al. | |
| 5,641,053 A | 6/1997 | Nannini et al. | |
| 5,769,949 A | 6/1998 | Cienkus et al. | |
| 5,842,824 A | 12/1998 | Nishi | |
| 5,879,458 A | 3/1999 | Roberson, Jr. et al. | |
| 5,906,262 A | 5/1999 | Miki | |
| 5,927,472 A | 7/1999 | Neef et al. | |
| 5,934,444 A | 8/1999 | Kierpaul et al. | |
| 5,955,857 A | 9/1999 | Kwon et al. | |
| 5,957,648 A | 9/1999 | Bachrach | |
| 5,964,561 A | 10/1999 | Marohl | |
| 5,980,183 A | 11/1999 | Fosnight | |
| 5,988,354 A | 11/1999 | Spatafora et al. | |
| 6,079,927 A | 6/2000 | Muka | |
| 6,089,811 A | 7/2000 | Watanabe et al. | |
| 6,092,678 A | 7/2000 | Kawano et al. | |
| 6,094,322 A | 7/2000 | Nakagomi et al. | |
| 6,129,496 A | 10/2000 | Iwasaki et al. | |
| 6,183,186 B1 | 2/2001 | Howells et al. | |
| 6,224,313 B1 | 5/2001 | Fukushima et al. | |
| 6,234,300 B1 | 5/2001 | De Vos et al. | |
| 6,280,134 B1 | 8/2001 | Nering | |
| 6,283,692 B1 | 9/2001 | Perlov et al. | |
| 6,336,546 B1 | 1/2002 | Lorenz | |
| 6,390,754 B2 | 5/2002 | Yamaga et al. | |
| 6,398,476 B1 | 6/2002 | Ando | |
| 6,411,859 B1 | 6/2002 | Conboy et al. | |
| 6,443,686 B1 | 9/2002 | Wiesler et al. | |
| 6,450,318 B1 | 9/2002 | Minardi | |
| 6,468,021 B1 | 10/2002 | Bonora et al. | |
| 6,579,052 B1 | 6/2003 | Bonora et al. | |
| 6,580,967 B2 | 6/2003 | Jevtic et al. | |
| 6,602,038 B2 | 8/2003 | Ahn et al. | |
| 6,602,128 B1 | 8/2003 | Spengler | |
| 6,733,243 B2 | 5/2004 | Ogata et al. | |
| 6,784,572 B1 | 8/2004 | Backman et al. | |
| 6,820,561 B2 | 11/2004 | Soldavini et al. | |
| 6,827,200 B1 | 12/2004 | Rhodes | |
| 6,848,882 B2 | 2/2005 | Chen et al. | |
| 6,851,913 B2 | 2/2005 | Iizuka | |
| 6,876,896 B1* | 4/2005 | Ortiz et al. | 700/112 |
| 6,877,944 B2 | 4/2005 | Peiter | |
| 6,990,721 B2 | 1/2006 | Mariano et al. | |
| 7,051,870 B2 | 5/2006 | Schoendienst et al. | |
| 7,077,264 B2 | 7/2006 | Rice et al. | |
| 7,153,083 B2 | 12/2006 | Wiesler et al. | |
| 7,156,221 B2 | 1/2007 | Rice et al. | |
| 7,165,927 B2 | 1/2007 | Doherty et al. | |
| 7,234,584 B2 | 6/2007 | Rice et al. | |
| 7,243,000 B2 | 7/2007 | Ohashi et al. | |
| 2001/0043849 A1 | 11/2001 | Perlov et al. | |
| 2002/0025244 A1 | 2/2002 | Kim | |
| 2002/0079199 A1 | 6/2002 | Wipf | |
| 2004/0062633 A1 | 4/2004 | Rice et al. | |
| 2004/0081538 A1* | 4/2004 | Rice et al. | 414/222.01 |
| 2004/0109746 A1 | 6/2004 | Suzuki | |
| 2004/0149672 A1 | 8/2004 | Motoori et al. | |
| 2004/0265107 A1 | 12/2004 | Kim et al. | |
| 2005/0040662 A1 | 2/2005 | Rice | |
| 2005/0095110 A1 | 5/2005 | Lowrance et al. | |
| 2005/0228525 A1 | 10/2005 | Brill et al. | |
| 2005/0245101 A1 | 11/2005 | Brill et al. | |
| 2006/0051192 A1 | 3/2006 | Fujiki | |
| 2006/0072986 A1 | 4/2006 | Perlov | |
| 2006/0099054 A1 | 5/2006 | Friedman | |
| 2006/0182553 A1 | 8/2006 | Yamamoto et al. | |
| 2007/0059144 A1 | 3/2007 | Lowrance | |
| 2007/0059153 A1 | 3/2007 | Lowrance | |

FOREIGN PATENT DOCUMENTS

| | | |
|---|---|---|
| EP | 1 569 261 A2 | 8/2005 |
| JP | 1-067932 | 3/1989 |
| JP | 3-244121 | 10/1991 |
| JP | 4-158508 | 6/1992 |
| JP | 06-263244 | 9/1994 |
| JP | 06-071356 | 10/1994 |
| JP | 07-156794 | 6/1995 |
| JP | 07-251903 | 10/1995 |
| WO | WO 98/46503 | 10/1998 |
| WO | WO 99/02436 | 1/1999 |
| WO | WO 07/033248 | 3/2007 |
| WO | WO 07/033249 | 3/2007 |
| WO | WO 07/033257 | 3/2007 |

OTHER PUBLICATIONS

9613/02/PCT (PCT/US06/035653) ISR and WO dated Sep. 11, 2007.
9613/03/PCT (PCT/US06/035688) ISR and WO dated Aug. 13, 2007.
9613/PCT (PCT/US06/035652) IPRP and WrO mailed on Mar. 27, 2008.
9613/02/PCT (PCT/US06/035653) IPRP and WO dated Mar. 27, 2008.
9613/03/PCT (PCT/US06/035688) IPRP and WO dated Mar. 27, 2008.
9613/CHINA (Application No. 200610127254.5) OA dated Dec. 7, 2007.
9613/CHINA (Application No. 200610127254.5) OA dated Oct. 5, 2008.
9613/CHINA (Application No. 200610127254.5) OA dated Feb. 6, 2009.
9613/SK (Application No. 2006-89071) OA dated Sep. 11, 2007.
9613/SK (Application No. 2006-89071) OA dated Oct. 29, 2008.
9613/02/CHINA (Application No. 200610127253.0) OA dated Nov. 16, 2007.
9613/02/CHINA (Application No. 200610127253.0) OA dated Jun. 13, 2008.
9613/02/SK (Application No. 2006-89181) OA dated Sep. 11, 2007.
9613/02/SK (Application No. 2006-89181) OA dated Nov. 11, 2008.
9613/03/CHINA (Application No. 200610127252.6) OA dated Nov. 9, 2007.
9613/03/CHINA (Application No. 200610127252.6) OA dated Aug. 8, 2008.
9613/03/SK (Application No. 2006-89183) OA dated Sep. 11, 2007.
9613/03/SK (Application No. 2006-89183) OA dated Oct. 28, 2008.

* cited by examiner

METHODS AND APPARATUS FOR A BAND TO BAND TRANSFER MODULE

CROSS REFERENCE TO RELATED APPLICATIONS

The present application claims priority to U.S. Provisional Patent Application Ser. No. 60/717,335, filed Sep. 14, 2005 and titled "METHODS AND APPARATUS FOR A TRANSFER STATION", which is hereby incorporated by reference herein in its entirety.

The present application also claims priority to U.S. Provisional Patent Application Ser. No. 60/717,150, filed Sep. 14, 2005 and titled "METHODS AND APPARATUS FOR A TRANSPORT LIFT ASSEMBLY", which is hereby incorporated by reference herein in its entirety.

The present application also claims priority to U.S. Provisional Patent Application Ser. No. 60/717,336, filed Sep. 14, 2005 and titled "METHODS AND APPARATUS FOR A BAND TO BAND TRANSFER MODULE", which is hereby incorporated by reference herein in its entirety.

The present application is also related to the following commonly-assigned, co-pending U.S. patent applications, each of which is hereby incorporated herein by reference in its entirety for all purposes:

U.S. patent application Ser. No. 10/650,310, filed Aug. 28, 2003 and titled "System For Transporting Substrate Carriers";

U.S. patent application Ser. No. 10/764,982, filed Jan. 26, 2004 and titled "Methods and Apparatus for Transporting Substrate Carriers";

U.S. patent application Ser. No. 10/650,480, filed Aug. 28, 2003 and titled "Substrate Carrier Handler That Unloads Substrate Carriers Directly From a Moving Conveyor";

U.S. patent application Ser. No. 10/764,820, filed Jan. 26, 2004, and titled "Overhead Transfer Flange and Support for Suspending Substrate Carrier"; and U.S. patent application Ser. No. 10/987,955, filed Nov. 12, 2004, and titled "Break-Away Positioning Conveyor Mount For Accommodating Conveyor Belt Bends".

FIELD OF THE INVENTION

The present invention relates generally to semiconductor device fabrication systems, and is more particularly concerned with transportation of substrate carriers within a fabrication facility.

BACKGROUND OF THE INVENTION

Manufacturing of electronic devices typically involves performing a sequence of procedures with respect to a substrate such as a silicon substrate, a glass plate, etc. (Such substrates may also be referred to as wafers, whether patterned or unpatterned.) These steps may include polishing, deposition, etching, photolithography, heat treatment, and so forth. Usually a number of different processing steps may be performed in a single processing system or "tool" which includes a plurality of processing chambers. However, it is generally the case that other processes are required to be performed at other processing locations within a fabrication facility, and it is accordingly necessary that substrates be transported within the fabrication facility from one processing tool to another. Depending upon the type of electronic device to be manufactured, there may be a relatively large number of processing steps required to be performed at a considerable number of different processing tools/locations within the fabrication facility.

It is conventional to transport substrates from one processing location to another via substrate carriers such as sealed pods, cassettes, containers, open trays, cassettes and so forth. It is also conventional to employ automated substrate carrier transport devices, such as automatic guided vehicles, overhead transport systems, substrate carrier handling robots, etc., to move substrate carriers from tool to tool within the fabrication facility or to transfer substrate carriers from or to a substrate carrier transport device.

For an individual substrate, the total device fabrication process, from formation of the substrate to cutting of individual electronic devices from the finished substrate, may require an elapsed time that is measured in weeks or months. Accordingly it would be desirable to reduce substrate transfer time in an effort to reduce non-value added time.

SUMMARY OF THE INVENTION

In a first aspect of the invention, an apparatus is provided that includes a first assembly adapted to remove a substrate carrier from a source conveyor traveling at a first speed while a portion the source conveyor is in motion within a first transfer zone of the band to band transfer apparatus; and a second assembly adapted to load a substrate carrier onto a destination conveyor traveling at a second speed while a portion of the destination conveyor is in motion within a second transfer zone of the band to band transfer apparatus.

In a second aspect of the invention, a method is provided that includes removing a substrate carrier from a source conveyor traveling at a first speed while a portion the source conveyor is in motion within a first transfer zone of the band to band transfer apparatus; and loading the substrate carrier onto a destination conveyor traveling at a second speed while a portion of the destination conveyor is in motion within a second transfer zone of the band to band transfer apparatus.

In a third aspect of the invention, a system is provided that includes a first conveyor traveling at a first speed; a second conveyor traveling at a second speed; and a band to band transfer apparatus disposed adjacent the first and second conveyors and including: a first assembly adapted to remove a substrate carrier from the first conveyor while a portion the first conveyor is in motion within a first transfer zone of the band to band transfer apparatus, and a second assembly adapted to load a substrate carrier onto the second conveyor while a portion of the second conveyor is in motion within a second transfer zone of the band transfer apparatus.

Numerous other aspects are provided, as are apparatus, systems and computer program products in accordance with these and other aspects of the invention. Each computer program product described herein may be carried by a medium readable by a computer (e.g., a carrier wave signal, a floppy disc, a compact disc, a DVD, a hard drive, a random access memory, etc.).

Other features and aspects of the present invention will become more fully apparent from the following detailed description, the appended claims and the accompanying drawings.

DETAILED DESCRIPTION

Figure 1:
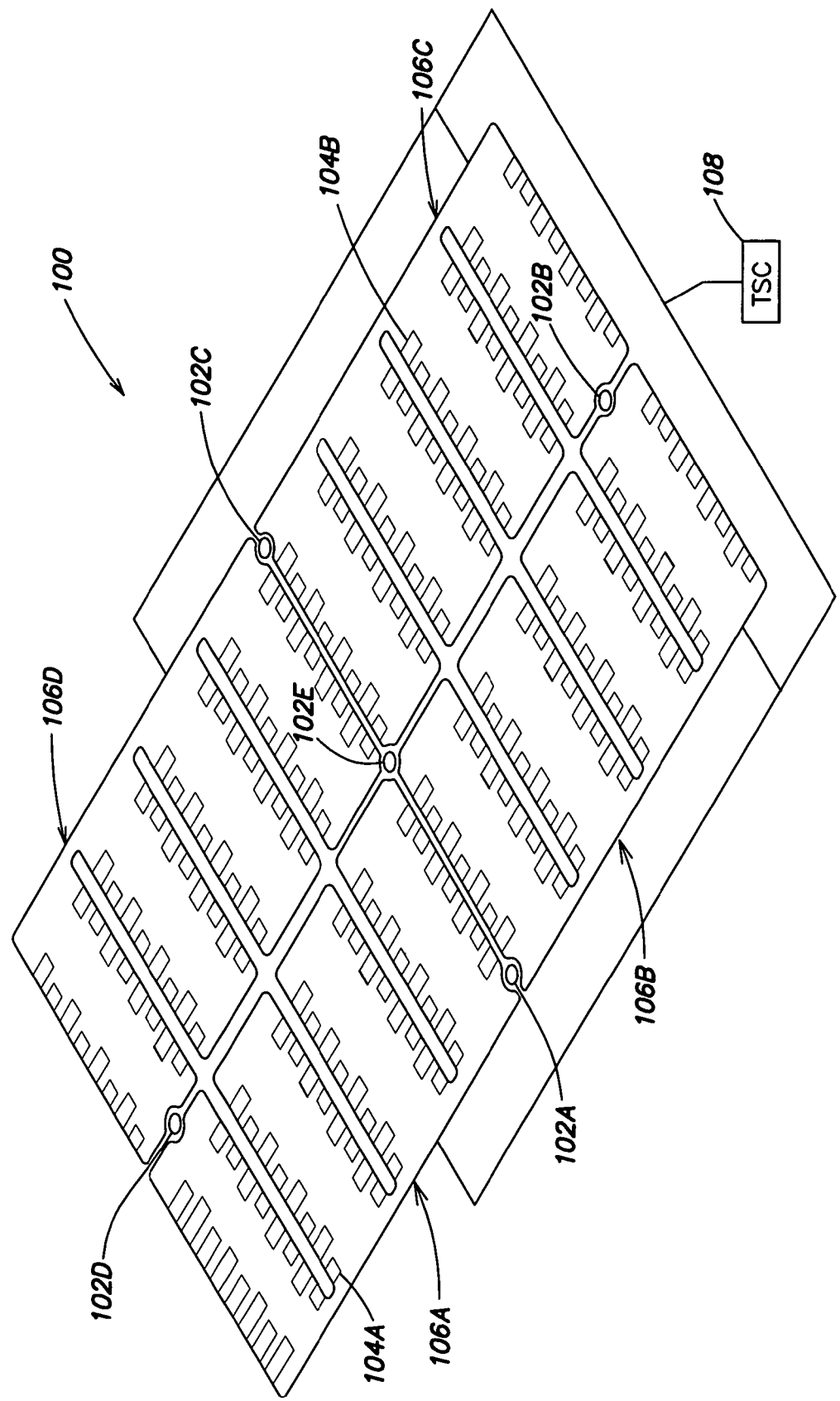
FIG. 1 is a schematic representation of a electronic device manufacturing facility employing transfer stations according to embodiments of the present invention.

Aspects of the present invention provide methods and apparatus for transferring carriers (e.g., substrate carriers) between two or more conveyors (e.g., continuously moving high-speed overhead transport systems (OHT systems)) within an electronic device manufacturing facility (Fab). The invention includes a transfer station with a plurality of independent transport lift assemblies (TLAs) that are each adapted to align with a moving carrier on a conveyor, disengage the carrier from the conveyor (e.g., using a lift assembly), transport the carrier to a second conveyor, and transfer (e.g., mount) the carrier to the second conveyor. The inventive transfer station enables transfers between conveyors without having to stop the conveyors or TLAs and also enables continuous transfer of carriers as the carriers arrive at the transfer station. In other words, as fast as the carriers arrive on one conveyor, the transfer station of the present invention can operate to move the arriving carriers to another conveyor (e.g., with available or open carrier positions).

The transfer station may include a track that guides the TLAs to align with the conveyors. In one or more embodiments, the track may be a circular track that is disposed in close proximity to each of the conveyors. In some embodiments, other shape tracks may be used (e.g., elliptical). For example, a portion of each conveyor may pass directly over a different portion of the track. A drive system (e.g., a closed-path linear motor) may be provided to propel the TLAs around the track. In addition, a control system may be provided to receive information about arriving carriers and/or cradles and control the drive system to adjust an individual TLA's speed to align with an incoming carrier (e.g., in anticipation of an unload operation) or incoming conveyor location such as a cradle (e.g., in anticipation of a load operation). The control system may also control the drive system to adjust an individual TLA's speed as part of the actual unloading and loading process. In some embodiments, the track and lower portion of the TLAs may be surrounded by an enclosure within which a negative air pressure is maintained to capture any potentially contaminating particles. The enclosure may include one or more access doors that allow rapid replacement of TLAs.

Each TLA may include, for example, wireless communication facilities to receive control signals (e.g., using a protocol such as BLUETOOTH®, from the transfer station control system that directs a TLA to remove a carrier from a conveyor or mount a carrier on a conveyor. In response to such instructions, an individual TLA controller on board the TLAs may be preprogrammed to cause the TLAs to execute a load or unload procedure as instructed by the transfer station controller/control system.

The TLAs may include a lift assembly that includes an end effector with kinematic features to coupled to, support, and/or align with substrate carriers. In some embodiments, the TLA may include both horizontal and vertical oriented sets of wheels upon which the TLA travels around the track. In a circular track embodiment, the vertical oriented set of wheels may be canted so that on its own, the TLA follows a circular path that matches the diameter of the track. This feature of the TLA may reduce friction on the wheels and thus, reduce particle generation.

Turning to FIG. 1, a schematic representation of an electronic device manufacturing facility (Fab) 100 employing transfer stations 102A-E is depicted. The Fab 100 includes numerous processing tools 104A, 104B (only two of which are representatively labeled) that are served by conveyors 106A-D. The transfer stations 102A-E and/or conveyors 106A-D may be coupled to and controlled by one or more transport system controllers (TSC) 108.

In operation, the transfer stations 102A-E, conveyors 106A-D, and TSC 108 may be part of a continuously moving high-speed overhead transport system (OHT system) that is adapted to deliver carriers (not pictured) containing one or more substrates to the processing tools 104A, 104B (and/or other processing tools of the Fab 100). Each of the conveyors 106A-D may be implemented as a closed loop band that is especially well suited for transporting small lot size carriers, such as substrate carriers that hold a single substrate or substantially fewer than twenty-five substrates (e.g., less than thirteen and in some embodiments, five or less substrates). The particular example Fab 100 depicted in FIG. 1 includes an OHT system with four independent conveyors 106A-D, each including several features that make the example OHT system particularly suitable for using small lot size carriers including: high-speed, low maintenance, constantly moving conveyors 106A-D; a carrier loading/unloading function that does not require stopping or slowing the conveyors 106A-D; conveyors 106A-D that are able to physically support many carriers at one time; and flexible conveyors 106A-D that may be readily customized to a desired transport path. These features are described further below.

Previously incorporated U.S. patent application Ser. No. 10/650,310, filed Aug. 28, 2003 and titled "System For Transporting Substrate Carriers", discloses a substrate carrier transport system or similar delivery system that includes a conveyor for substrate carriers that is intended to be constantly in motion during operation of the Fab which it serves. The constantly moving conveyor is intended to facilitate rapid transportation of substrates within the Fab so as to reduce the total "dwell" time of each substrate in the Fab.

To operate a Fab in this manner, methods and apparatus are provided for unloading substrate carriers from the conveyor, and for loading substrate carriers onto the conveyor, while the conveyor is in motion. Previously incorporated U.S. patent application Ser. No. 10/650,480, filed Aug. 28, 2003 and titled "Substrate Carrier Handler That Unloads Substrate Carriers Directly From a Moving Conveyor", discloses a substrate carrier handler at a substrate loading station or "tool station" (e.g., adjacent a processing tool or integrated with a processing tool) that may perform such loading/unloading operations with respect to a moving conveyor. For example, a substrate loading station or tool station may include a horizontal guide or crane that is moveable vertically, and an end effector that is moveable horizontally along the horizontal guide. Other configurations for moving the end effector vertically and/or horizontally are provided.

To unload a substrate carrier from a moving conveyor that transfers substrate carriers (a "substrate carrier conveyor") and that passes by the substrate loading station, the end effector is moved horizontally at a velocity that substantially matches the velocity of the substrate carrier as it is being transported by the substrate carrier conveyor (e.g., by substantially matching substrate carrier speed in a horizontal direction). In addition, the end effector may be maintained in a position adjacent the substrate carrier as the substrate carrier is being transported. The end effector thus may substantially match a position of the substrate carrier while substantially matching a velocity of the substrate carrier. Likewise, conveyor position and/or velocity may be substantially matched.

While the end effector substantially matches the substrate carrier's velocity (and/or position), the end effector is raised so that the end effector contacts the substrate carrier and disengages the substrate carrier from the substrate carrier conveyor. A substrate carrier similarly may be loaded onto the moving substrate carrier conveyor by substantially matching end effector and conveyor velocities (and/or positions) during loading. In at least one embodiment, such substrate carrier handoffs between the end effector and substrate carrier conveyor are performed at a substantially zero relative velocity and/or acceleration between the end effector and the substrate carrier.

Previously incorporated U.S. patent application Ser. No. 10/764,982, filed Jan. 26, 2004 and titled "Methods and Apparatus for Transporting Substrate Carriers", describes a conveyor system that may be employed with the above-described substrate carrier transport system and/or tool station for transporting substrate carriers between one or more processing tools of a electronic device manufacturing facility. The conveyor system may include a ribbon (or "band") that forms a closed loop within at least a portion of the electronic device manufacturing facility and that transports substrate carriers therein. In one or more embodiments, the ribbon or band may be formed from stainless steel, polycarbonate, composite materials (e.g., carbon graphite, fiberglass, etc.), steel or otherwise reinforced polyurethane, epoxy laminates, plastic or polymer materials that include stainless steel, fabric (e.g., carbon fiber, fiberglass, Kevlar® available from DuPont Corporation, polyethylene, steel mesh, etc.) or another stiffening material, etc. By orienting the ribbon so that a thick portion of the ribbon resides within a vertical plane and a thin portion of the ribbon resides within a horizontal plane, the ribbon is flexible in the horizontal plane and rigid in the vertical plane. Such a configuration allows the conveyor to be constructed and implemented inexpensively. For example, the ribbon requires little material to construct, is easy to fabricate and, due to its vertical rigidity/strength, can support the weight of numerous substrate carriers without supplemental support structure (such as rollers or other similar mechanisms used in conventional, horizontally-oriented belt-type conveyor systems). Furthermore, the conveyor system is highly customizable because the ribbon may be bent, bowed or otherwise shaped into numerous configurations due to its lateral flexibility.

As indicated above, the example Fab 100 of FIG. 1 includes four conveyors 106A-D (e.g., ribbons or bands) that each form a loop through different quadrants of the example Fab 100. The conveyors 106A-D may comprise, for example, the ribbons described in previously incorporated U.S. patent application Ser. No. 10/764,982. Also as indicated above, the conveyors 106A-D may transport carriers (not shown) between processing tools 104A, 104B and each of the conveyors 106A-D comprise straight portions and curved portions to form non-intersecting closed loops. Any number of processing tools 104A, 104B, conveyors 106A-D, and/or loop configurations may be employed.

The transfer stations 102A-E allow carriers to be moved from one conveyor to another. For example, transfer station 102A may be used to move carriers from conveyor 106A to conveyor 106B. In some embodiments, a conveyor 102E may be adapted to allow direct transfer of carriers between more than two conveyors. For example, transfer station 102E may be used to move carriers from conveyor 106A to conveyor 106B, 106C, and/or 106D, from conveyor 106B to conveyor 106A, 106C and/or 106D, from conveyor 106C to conveyor 106A, 106B, and/or 106D, and from conveyor 106D to conveyor 106A, 106B, and/or 106C. Any number of conveyors may be served by a transfer station, not just two or four as depicted in the example of FIG. 1. Also, although not shown in FIG. 1, in additional or alternative embodiments, a transfer station may be adapted to transfer carriers from a conveyor directly to a processing tool or storage facility via a substrate loading station.

Each processing tool may include a substrate carrier handler at a substrate loading station or "tool station" (not pictured) of the processing tool 104A for unloading a substrate carrier from or for loading a substrate carrier onto a respective conveyor 106A-D as the conveyor passes by the tool station (as described in previously incorporated U.S. patent application Ser. No. 10/650,480). For example, an end effector (not shown) of a tool station of the processing tool 104A may be moved horizontally at a velocity that substantially matches a velocity of the substrate carrier as it is being transported by the conveyor 106A, maintained in a position adjacent the substrate carrier as the substrate carrier is being transported and raised so that the end effector contacts the substrate carrier and disengages the substrate carrier from the conveyor 106A. The substrate carrier then may be delivered to the processing tool 104A. A substrate carrier similarly may be loaded onto the moving conveyor 106A by substantially matching end effector and ribbon velocities (and/or positions) during loading.

Each tool station may include one or more load ports or similar locations where substrates or substrate carriers are placed for transfer to and/or from a processing tool (e.g., one or more docking stations, although transfer locations that do not employ docking/undocking movement may be employed). Various substrate carrier storage locations also may be provided at each tool station for substrate carrier buffering at a processing tool.

The example OHT system depicted in FIG. 1 includes a transport system controller (TSC) 108 for monitoring, controlling and/or directing operation of the conveyors 106A-D, the tool station at each processing tool 104A, 104B, and/or the transfer stations 102A-E. Although not shown in FIG. 1, the TSC 108 may be coupled to and/or in communication with each tool station at each processing tool 104A, 104B, and/or each transfer station 102A-E. For example the TSC 108 may control/monitor the speed and/or status of the conveyors 106A-D, allocate cradles of the conveyors 106A-D that are used to support/transport substrate carriers, monitor the status of such cradles, provide such information to each tool station and/or transfer station 102A-E, or the like. Likewise, each tool station may include tool station software (TSS) for controlling tool station operation (e.g., loading or unloading of substrate carriers to/from the conveyors 106A-D, transporting of substrate carriers to/from load ports or storage locations of the tool station and/or processing tool serviced by the tool station, etc.). A material control system (MCS) (not shown) may be coupled to and/or in communication with the TSC 108, the transfer stations 102A-E, and/or the tool station software of each tool station of each processing tool for affecting operation of the same. The TSC 108, the transfer stations 102A-E, each TSS and/or the MCS may include a scheduler (not shown) for controlling scheduling of the operations performed by the TSC 108, the transfer stations 102A-E, the TSS and/or the MCS.

The topology of the Fab 100 depicted in FIG. 1 is designed to make the Fab 100 more fault tolerant while at the same time, enhance performance characteristics, particularly in terms of substrate throughput. In some embodiments, a single conveyor may be used throughout a Fab. However, if the conveyor fails or must be stopped in a single conveyor Fab, all carrier transfers via the conveyor are stopped. However, through the use of multiple conveyors 106A-D and multiple transfer stations 102A-E, transport of carriers may continue even if one or more of the conveyors 102A-D are stopped. For example, if a carrier needs to be transported from processing tool 104A to processing tool 104B and both conveyor 106B and transfer station 102E have been stopped for repair, the carrier may still be transported between the processing tools 104A, 104B via conveyor 106A, transfer station 102D, conveyor 106D, transfer station 102C, and conveyor 106C.

Figure 2:
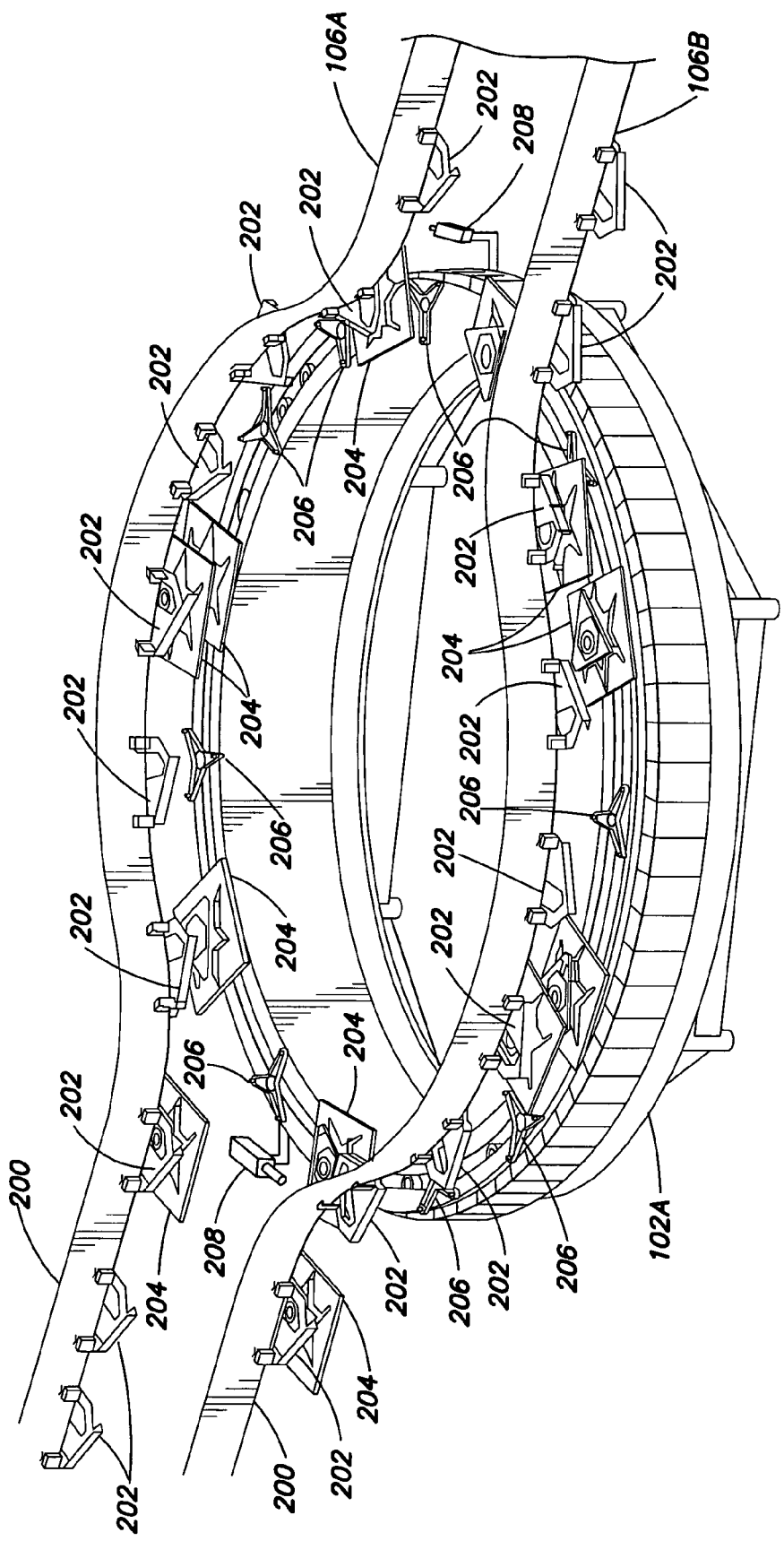
FIG. 2 is a perspective drawing of a transfer station and conveyors according to embodiments of the present invention.

Turning to FIG. 2, a perspective drawing of an example embodiment of a transfer station 102A and conveyors 106A, 106B (only the bands 200 are shown) is depicted. Cradles 202 are coupled to each of the bands 200 of the conveyors 106A, 106B and are adapted to support substrate carriers 204. TLAs 206 which may each include a lift assembly (described below) are also adapted to support substrate carriers 204. In the embodiment depicted in FIG. 2, cradles 202 support the carriers 204 from above and TLAs 206 support carriers 204 from below. However, other alternative configurations are possible including TLAs that support carriers from above and/or cradles that support carriers from below.

A transfer station 102A may also include sensors 208 coupled to the transfer station and/or the conveyors 106A, 106B. The sensors 208 may include cameras, through-beam detectors, or other devices suitable for detecting/determining the arrival and/or velocity of a carrier 204 and/or an empty cradle 202. In addition, sensors 208 may be used to determine/detect the position of a lift assembly on a TLA (e.g., up or down), the speed and/or position of a TLA, and/or the relative position, speed, and/or acceleration of a TLA/carrier to a cradle/carrier and vice versa. Such information may be provided to the TSC 108 (FIG. 1) and employed to control/affect substrate carrier transfers.

As indicated above, the particular depiction of the conveyors 106A, 106B in FIG. 2 omits the support, guide, and drive apparatus that may be used in conjunction with the depicted bands 200. Support apparatus may be used to hold or support the bands 200 in a horizontal plane at a desired height above the transfer station 102A. Guide apparatus may be used to direct the bands 200 in a path that substantially matches a portion of the track of the transfer station 102A. Drive apparatus may be used to move the bands 200 through the guide apparatus. In some embodiments, a series of motor driven rollers mounted to a frame may be used to support, guide, and drive the bands 200. The bands 200 are dispose so that carriers 204 brought to the transfer station 102A via the conveyors 106A, 106B may be unloaded from cradles 202 of the conveyors 106A, 106B by TLAs 206 of the transfer station 102A. Likewise, empty cradles 202 arriving at the transfer station 102A on the bands 200 may be loaded with carriers 204 by the TLAs 206.

FIG. 2 depicts a transfer station 102A suitably sized to accommodate two conveyors 106A, 106B. Depending on various factors including the speeds of the bands, the spacing of cradles on the bands, and the amount of time needed to remove/mount a carrier, the size of a transfer station may be altered to accommodate transfers from/to any number of bands. For two bands 200 as depicted in FIG. 2 that are moving at approximately the same speed, for example, the diameter of a transfer station that accommodates carriers spaced approximately 500 mm apart and arriving at a rate of approximately 180 carriers per minute, may be as small as approximately 2.5 meters. Transfer stations having smaller diameters are possible, particularly with slower moving bands and/or with different configurations. TLAs on the example transfer station described above may circulate at approximately 12 revolutions per minute and such a transfer station is capable of transferring 10,800 carriers per hour from one band to another.

In operation, the TLAs 206 continuously circulate in the transfer station 102A, independently unloading, transporting, and loading carriers 204 as directed by the TSC 108 (FIG. 1). For example, the TSC 108 may receive information from sensors 208 or the transfer station 102A indicating the arrival of a carrier 204. The TSC 108 may then direct the transfer station 102A to align an available TLA 206 with the arriving carrier 204 by matching speed with the carrier 204. The TLA 206 may receive instructions from the TSC 108 and/or the transfer station 102A, and unload the carrier 204 from the band 200 and transport the carrier 204 to the other side of the transfer station 102A. The TLA 206 then may load the carrier 204 onto an arriving empty/available cradle 202 detected by the sensor 208.

Figure 3:
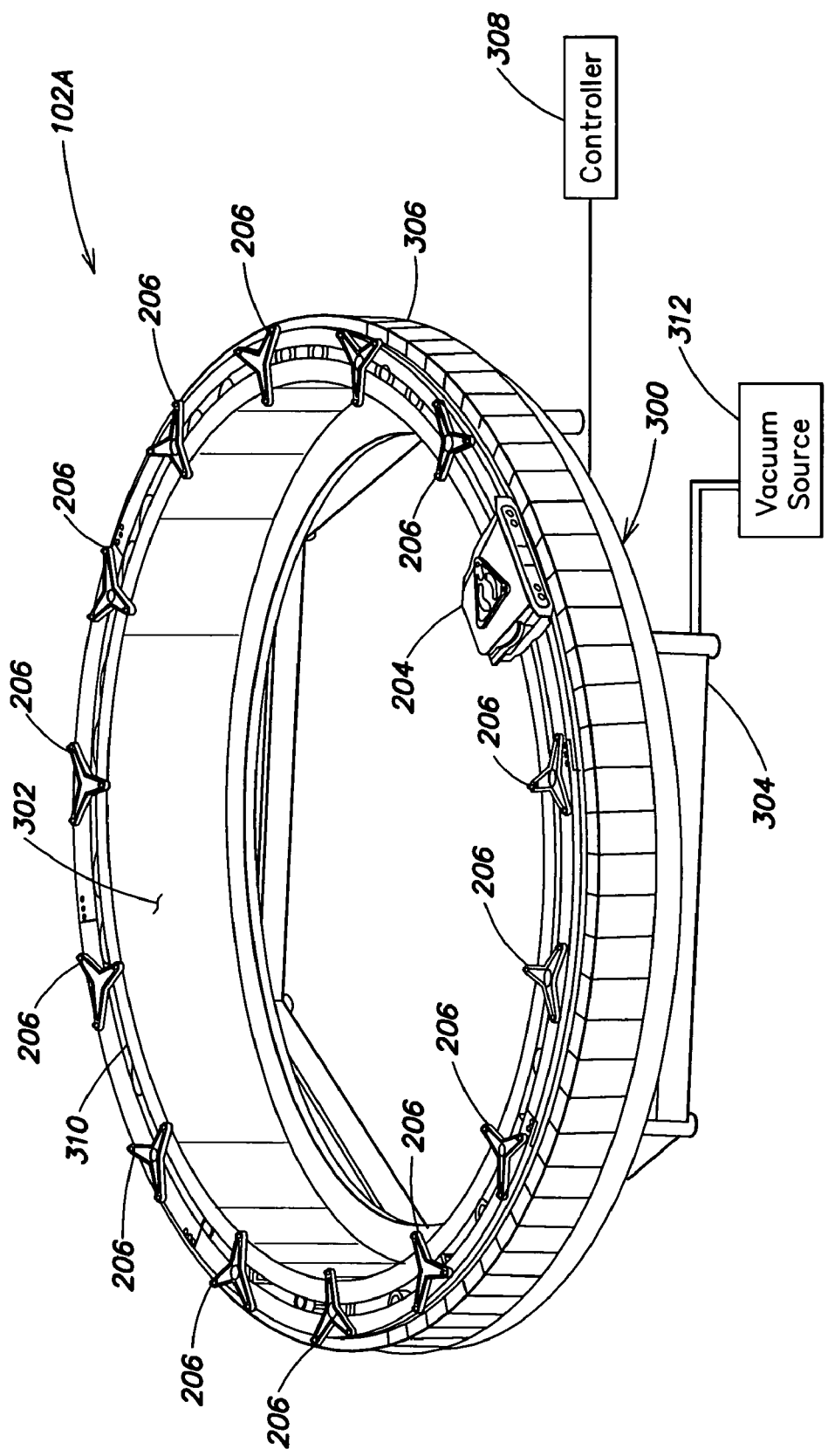
FIG. 3 is a perspective drawing of the transfer station of FIG. 2.

Turning to FIG. 3, a perspective drawing of the transfer station 102A of FIG. 2 is shown without conveyors. A single carrier 204 is shown supported by a TLA 206 (obscured) under the carrier 204. The transfer station 102A includes a track 300 that is surrounded by an enclosure 302. The track 300 is supported by a frame 304. A drive system 306 may surround the perimeter of the track 300 and a controller 308 may be coupled to the transfer station 102A. The controller 308 may be a local controller.

In operation, the TLAs 206 transport carriers 204 around the track 300. As will be described in detail below, the TLAs 206 can also load and unload carriers 204 from an overhead transport (OHT) system by raising and lowering a lift assembly while aligning with a cradle 202 on a conveyor 106A (of FIG. 2). The TLAs 206 are each driven by the drive mechanism 306, which, in some embodiments, may include a closed-path linear motor. As shown in FIG. 3, the linear motor may include an array of side-by-side armature windings or motor coils that can each be individually energized to each create a magnetic field to push or pull permanent magnets mounted on the TLAs 206. The present invention may be implemented so that the speed of the TLAs 206 may be independently controlled and adjusted via control of the drive mechanism 306. The drive mechanism 306 may be controlled by the TSC 108 (FIG. 1) directly or, alternatively, by a local controller 308 and, in some embodiments, under the direction of the TSC 108. Thus, the speed and position of each TLA 206 may be independently controlled via the drive mechanism 306 in response to signals from the controller 308 and/or the TSC 108. The controller 308 may control the speed and position of TLAs 206 in response to information from the sensors 208 (of FIG. 2) and/or in response to signals from the TLAs themselves. Further details regarding the construction and operation of linear motors may be found in U.S. Pat. No. 6,713,902 to Chitayat which is hereby incorporated herein by reference for all purposes.

The enclosure 302 may include a series of panels on both sides of the track 300 that define a volume within which the TLAs 206 travel. The enclosure 302 depicted in FIG. 3 includes an opening or slot 310 at the top from which the lift assembly of each TLA protrudes. In addition to supporting the track 300, the frame 304 may include an integral particle control system. For example, the frame 304 may be constructed of hollow, tubular members that are coupled to openings (not shown) in the bottom of the enclosure 302 and a vacuum source 312. Through the frame members, vacuum pressure may be applied to the volume defined by the enclosure 302. Any particles generated by the motion of the TLAs may thus be removed from the transfer station 102A via the openings in the bottom of the enclosure 302 and carried away via the frame 304. A separate particle control system (not shown) may alternatively or additionally be coupled directly to the enclosure 302 for removing particles therefrom.

Figure 4:
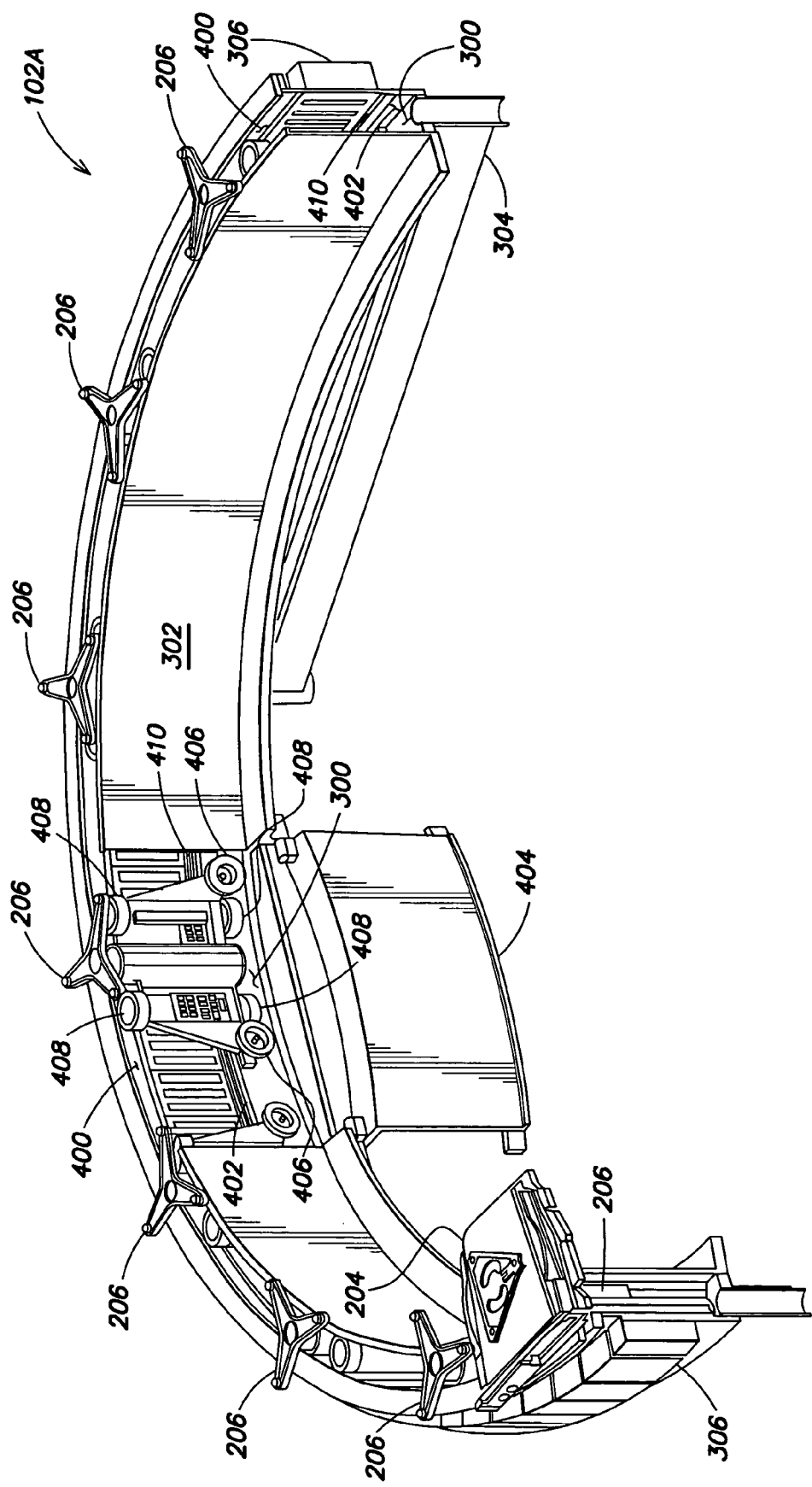
FIG. 4 is a cross-sectional perspective drawing of the transfer station of FIG. 2.

Turning to FIG. 4, a cross-sectional perspective drawing showing more details of the transfer station 102A of FIG. 2 is provided. As with FIG. 3, a single carrier 204 is shown supported by a TLA 206 under the carrier 204. The transfer station 102A includes the track 300 that is surrounded by the enclosure 302. The track 300 is supported by the frame 304 and the drive system 306 surrounds the perimeter of the track 300. In addition to the track 300, the TLAs 206 may contact an upper roadway 400 and lower roadway 402 that both run along the inner surface of the exterior portion of the enclosure 302. One or more access port doors 404 may be included in the interior portion of the enclosure 302. As shown through the opening of the access port door 404, the TLA 206 may include a set of two vertical wheels 406 and a set of four horizontal wheels 408. In some embodiments, more or less vertical and/or horizontal wheels may be included on a TLA. The transfer station 102A may further include a power transfer system 410 that also may run along the inner surface of the exterior portion of the enclosure 302 proximate to the TLAs.

As indicated above, the enclosure 302 may be a particle containment enclosure adapted to prevent potentially contaminating particles generated by moving parts within the enclosure 302 from being deposited or released into the atmosphere of the Fab 100. In some embodiments, a negative air pressure (e.g., vacuum pressure) may be maintained within the enclosure 302. In such embodiments, the negative air pressure may be applied via the frame 304 of the transfer station 102A and/or directly to the enclosure 302. The frame 304 may be embodied as a series of interconnected hollow members that provide a number of suction paths from the bottom of the enclosure 302 by which a vacuum may draw away any particles generated within the transfer station 102A. Thus, a down draft may be created within the enclosure 302 from top to bottom such that particles are pulled from the TLAs 206 and out of the transfer station 102A via the frame 304. Such a particle containment system may be used to adhere to a better than class 1000 clean room rating (e.g., maintain a particle density less than one thousand particles larger than 0.5 microns in each cubic foot of air space in compliance with Federal Standard 209) which is desirable within a Fab 100.

In operation, as the drive system 306 propels the TLAs 206 around the transfer station 102A, the vertical wheels 406 roll along the track 300. The vertical wheels 406 may be canted or otherwise adapted to cause the TLA 206 to naturally roll in a circle that matches the shape of the track 300. Thus, lateral rolling friction is minimized and particle generation is greatly reduced. Note that a circular track 300 that has a constant radius of curvature further allows the TLAs 206 with matched, canted vertical wheels 406 to roll with minimum friction and particle creation, thereby providing for a reduction in particulate contaminants being introduced into the manufacturing environment. In additional or alternative embodiments, the track 300 may be angled or banked at a constant pitch to minimize friction and particle generation.

To provide a balancing centripetal force, the horizontal wheels 408 also roll on the upper roadway 400 and lower roadway 402 as the TLAs 206 are propelled around the transfer station 102A. The track 300, the upper roadway 400, and the lower roadway 402 may each include a thin polycarbonate top layer that helps resist particle generation. Any other practicable material may alternatively be used as a surface for the track 300 and/or roadways 400, 402.

In some embodiments, the TLAs 206 may receive power to operate on-board functions (e.g., the lift assembly, wireless communications, sensors, etc.) from the transfer station 102A. The power transfer system 410 may include a slip ring that provides an electrical contact to each of the TLAs 206. Alternatively, transformers may be used to transfer power to the TLAS 206 without using a contact. In either embodiment, on-board batteries may be installed in the TLAs 206 to store energy received from the power transfer system 410.

As mentioned above, the enclosure 302 may include any number of access port doors 404 which can be opened on hinges as shown in FIG. 4 or completely removed so as to expose other components of the transfer station 102A. The access port doors 404 may be opened to perform any cleaning, maintenance, or repair operations. The access port door opening may be sufficiently large to allow a TLA 206 to be easily removed from the track 300 and replaced with a substitute TLA 206 within a matter of seconds.

Figure 5:
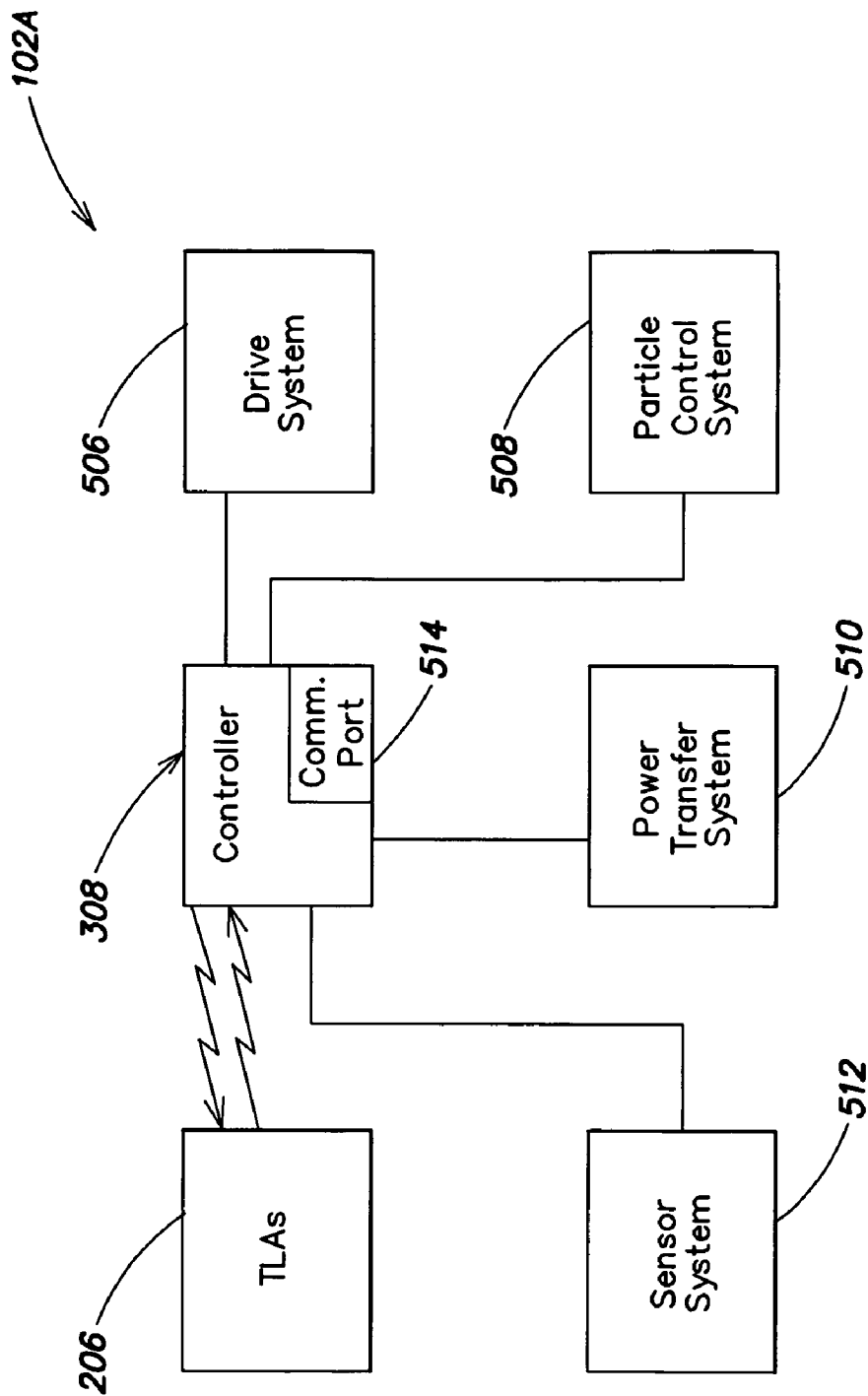
FIG. 5 is a block diagram of components of a transfer station according to embodiments of the present invention.

Turning to FIG. 5, various components of an example embodiment of a transfer station 102A are depicted in a block diagram. A controller 308 may be in wireless two-way communication with a number of TLAs 206. The controller 308 may also be coupled to a drive system 506, a particle control system 508, a power transfer system 510, and a sensor system 512. The controller 308 may also include a communications port 514 to communicate with a TSC and/or a MCS within the Fab.

The controller 308 may be implemented as any computer, microprocessor, or computer system which may be adapted or programmed to provide control over the operation of the transfer station 102A. In some embodiments, the controller 308 may be a network computer equipped with a communications port 514 for facilitating communications with other computers and/or systems. For example, the controller 308 can be controlled by, or provide information regarding the operation of the transfer station 102A or any system or component of the same, to an external computer or control system, such as, for example, a manufacturing execution system (MES) for a Fab.

The TLAs 206 (described in detail below) may communicate wirelessly with the controller 308 using any practicable protocol such as, for example, BLUETOOTH® or wireless Ethernet. In some embodiments, the TLAs 206 may provide status information to the controller 308, for example, indicating the completion of a transfer, a need for service, a current track position, an error condition, speed, "lift up," "lift down," "carrier centered," "low battery," "battery full," "power transfer disabled," "power transfer enabled", or the like. In some embodiments, the TLAs 206 may signal to the controller a need to accelerate or slow down to match the speed of a cradle or to remove a carrier from a cradle, for example. The controller 308 may, in response, control the drive system 506 to energize or deenergize an appropriate motor coil to achieve the desired effect on the TLA 206. In alternative or additional embodiments, the controller 308 may signal instructions to the TLAs 206 based on information received from the sensor system 512 and/or from a TSC (e.g., via the communication port 515). For example, the controller 308 may assign a TLA 206 to unload a carrier from a particular incoming cradle or to load a carrier onto an arriving cradle.

In another example, the controller 308 may signal a TLA 206 to unload a carrier from a conveyor, hold it for a specific amount of time (e.g., three revolutions around the transfer station 102A), and then load the carrier back onto the same conveyor. In this example, the transfer station 102A may serve to merely delay or relocate a particular carrier on a conveyor, for example, to give a downstream tool station more time to prepare for the arrival of the particular carrier. This may allow the carrier's substrates to be processed sooner instead of having to complete another full circuit on the conveyor because the tool station would not have been ready at the original arrival time.

In some embodiments, the particle control system 508, which may include a vacuum pump or other vacuum supply, may be controlled and/or monitored by the controller 308. For example, if a loss of vacuum pressure within the enclosure 302 (FIG. 3) is detected by the sensor system 512, the controller 308 may attempt to restart the particle control system 508. Likewise, the power transfer system 510 may, for example, be activated by the controller 308 in response to a signal from the TLAs 206 that onboard battery power is running low.

Figure 6:
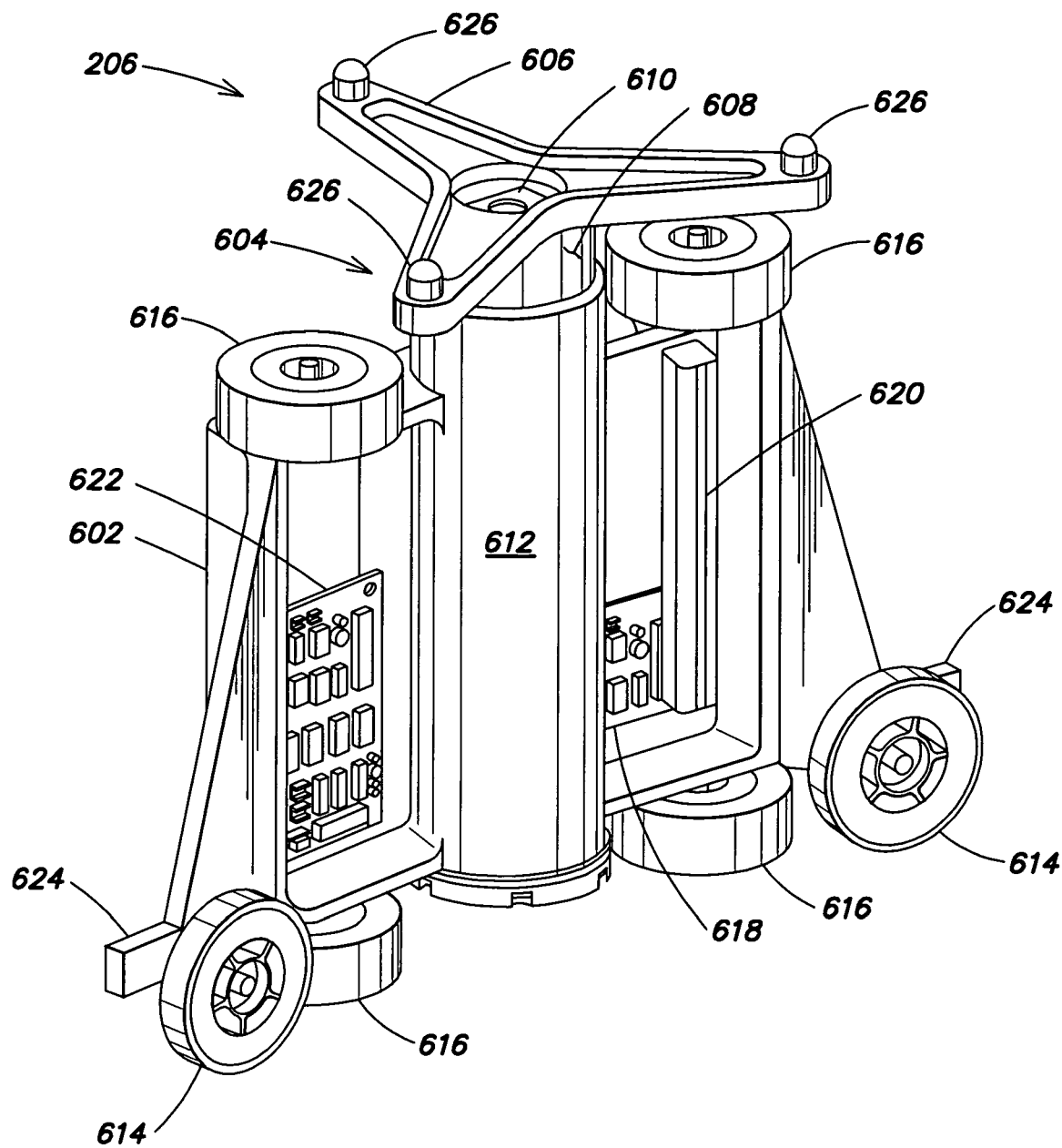
FIG. 6 is a perspective drawing of a front view of a transport lift assembly according to embodiments of the present invention.
Figure 7:
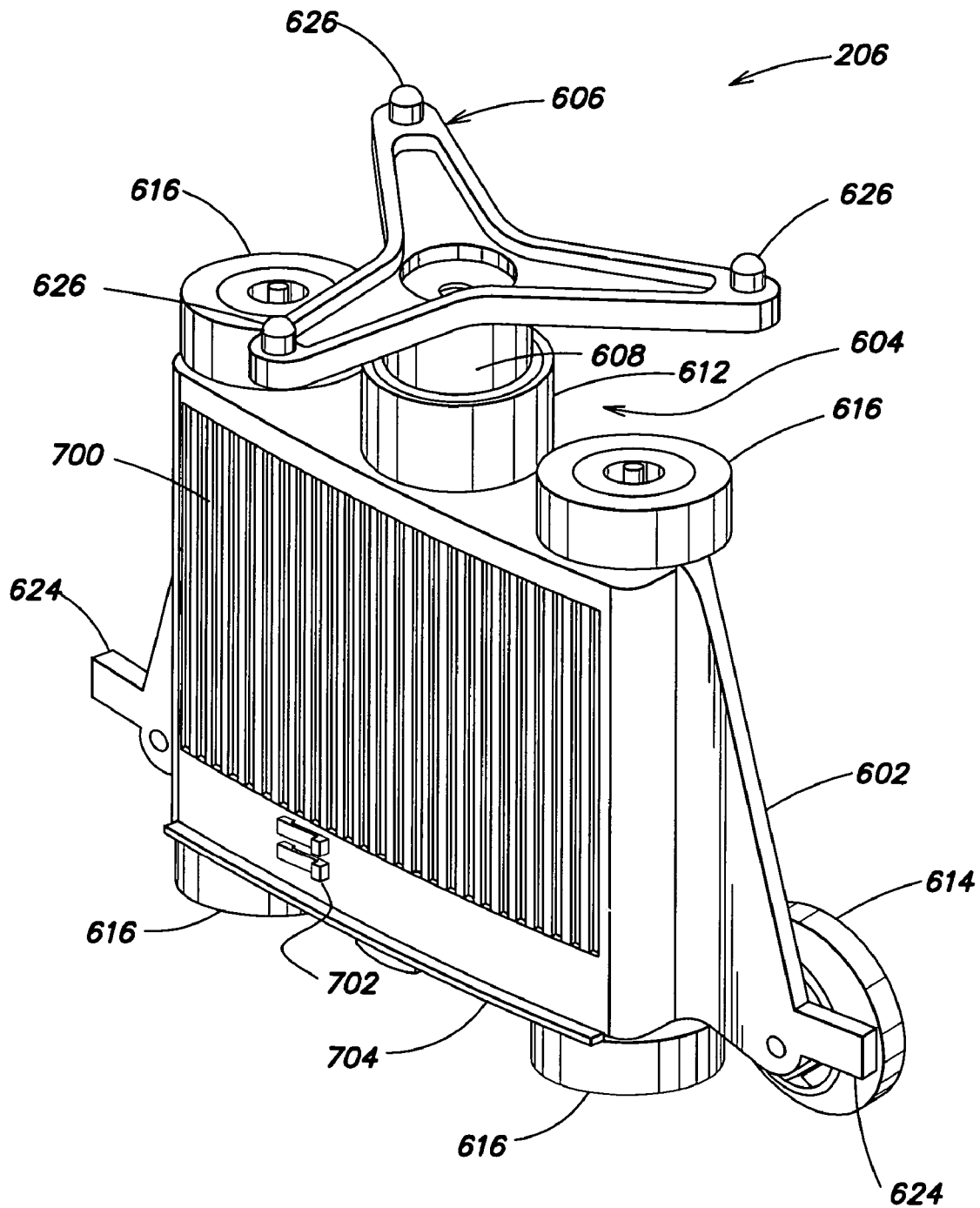
FIG. 7 is a perspective drawing of a rear view of a transport lift assembly according to embodiments of the present invention.

Turning to FIGS. 6 and 7, perspective drawings of a front view (FIG. 6) and rear view (FIG. 7) of an example embodiment of a transport lift assembly (TLA) 206 are provided. The TLA 206 includes a chassis 602 that supports a lift assembly 604 (shown in a lowered position). The lift assembly 604 includes a lift platform 606 (also referred to herein as an end effector) mounted on a lift slide 608 that is driven up and down by a linear lift actuator 610 within a lift tube 612. In addition to the lift assembly 604, a set of two vertical wheels 614, a set of four horizontal wheels 616, a power supply 618, a battery 620, a TLA controller 622, and front and rear bumpers 624 are supported by or mounted to the chassis 602. Referring to FIG. 7, a linear motor magnet array 700 and power pick-up contacts 702 are mounted on the rear side of the chassis 602. A position sensor 704 is mounted to the rear bottom edge of the chassis 602 and coupled to the TLA controller 622 depicted in FIG. 6.

With reference once again to both FIGS. 6 and 7, the chassis 602 may be constructed of any suitable material such as cast aluminum. In an exemplary embodiment, the chassis may be a single or integrated structure having the above-described components integrated therewith and/or attached thereto. In another exemplary embodiment, the chassis 602 may be formed of two or more structures.

In operation, the lift platform 606, which may include kinematic features 626, is adapted to engage mating kinematic features in the bottom of a substrate carrier 204 (FIG. 2) and to provide support when raising and lowering the carrier 204. When either loading a carrier onto a conveyor or unloading a carrier from a conveyor, the lift assembly 604 (and TLA 206) may follow a predetermined/preprogrammed motion profile (described in detail below with respect to FIGS. 11A-D) under the control of the TLA controller 622 and/or the controller 308. When loading a carrier onto a conveyor, the linear lift actuator 610 pushes the lift slide 608 up through the lift tube 612. This raises the lift platform 606 supporting the carrier to be loaded, up to the cradle so that a flange on top of the carrier engages the cradle. Likewise, when unloading a carrier from a conveyor, the linear lift actuator 610 pushes the lift slide 608 up through the lift tube 612 to raise the lift platform 606 so as to engage the kinematic features 626 in the mating recesses in the bottom of the carrier. The carrier is then lifted off of the cradle attached to the conveyor and lowered clear of the cradle.

As described above, a TLA 206 may include two sets of wheels 614, 616. The axels of the vertical wheels 614 may be angled relative to each other so that the TLA 206 tends to roll in a circular path. The angle of the axels relative to each other may be set such that the circular path that the TLA follows, matches the track 300 of the transfer station 102A. Alternatively or additionally, the vertical wheels 614 may themselves be angled such that the diameter of the wheel on one side is smaller than the diameter of the same wheel on the other side. Such a wheel naturally follows a circular path and the diameter of the circular path is a function of the relative difference in the diameters of the two sides of the wheel. The difference may be selected such that the wheels follow a circular path that matches the track 300 of the transfer station 102A. As indicated above, by angling the vertical wheels 614 and/or selecting angled wheels for use as the vertical wheels 614 (e.g., wheels adapted to follow a circular path that matches the track 300 of the transfer station 102A), rolling friction is reduced and potentially contaminating particle generation is minimized. Two vertical wheels 614 are depicted as being used in the TLA embodiment of FIG. 6, however, one, three, four, or more wheels 614 may be used in alternative embodiments. The vertical wheels may be made from a polyurethane or polyethylene material or any other practicable material. Polyurethane may be selected, for example, because of its characteristics including providing a quiet rolling surface.

Because each TLA 206 is operated independently of the other TLAs, in some embodiments, the possibility exists that two or more TLAs may contact each other while circulating within the transfer station 102A. Bumpers 624 may be provided on either end of the TLA 206 to protect the vertical wheels 614 (and the TLA 206) from other TLAs that may collide with the TLA 206 within the transfer station 102A. The bumpers 624 may be made from a shock absorbing material such as a low derometer polyurethane or any other practicable material.

The TLA 206 may also use horizontal wheels 616 to guide the TLA 206 in the transfer station 102A and provide centripetal support to the TLA 206 as it travels on the roadways 400, 402 of the transfer station 102A. The horizontal wheels 616 also serve to maintain the linear motor magnet array 700 and power pick-up contacts 702 on the rear of the TLA 206 at a constant distance from the drive system 306 and power transfer system 410, respectively. Four horizontal wheels 616 are depicted as being used in the TLA embodiment of FIG. 6, however, one, two, three, five, or more wheels 616 may be used in alternative embodiments. The horizontal wheels 616 may be made from a ultra high molecular weight (UHMW) polyethylene material or any other practicable material. UHMW polyethylene may be chosen, for example, because of its lubricity and high abrasion resistance.

In embodiments where the TLA 206 receives energy via power pick-up contacts 702, the contacts 702 are located on the TLA 206 so as to align with a slip ring in the transfer station 102A which embodies the power transfer system 410. The contacts 702 are coupled to the power supply 618 which is coupled to the battery 620, the TLA controller 622, and the linear lift actuator 610 via the TLA controller 622. In addition to supplying power to the TLA controller 622, the power supply 618 is operative to charge and maintain the battery 620 when the power transfer system 410 is enabled/supplying power and to draw power from the battery 620 when the power transfer system 410 is disabled/not supplying power.

In alternative embodiments, the power transfer system 410 may include a transformer coupled power transfer mechanism. The TLA 206 may be equipped with a transformer (e.g., in place of the power pick-up contacts 702) that generates electricity for the TLA 206 as it is moved through magnetic fields created by energized transformers disposed around the circumference of the transfer station 102A.

The linear motor magnet array 700 mounted on the TLA 206 provides magnets that are acted upon by the drive system 306. The array 700 may use very strong permanent magnets such as those made from neodemium or neodemium-boron. The drive system 306, which may include a closed-path linear motor, creates magnetic fields adjacent the TLA's linear motor magnet array 700 by energizing selected windings of the linear motor to push or pull the TLA's linear motor magnet array 700, and consequently the TLA 206. In this manner, the speed and position of the TLA 206 can be accurately controlled via the drive system 306. The drive system 306 may be controlled in response to TLA position information that is determined via the position sensor 704. The position sensor 704 may be a linear position sensor which allows accurate determination of the TLA's position in the transfer station 102A. The position sensor 704 may communicate with the drive system 306 directly or may be coupled to the TLA controller 622 to facilitate providing feedback to the transfer station controller 308/drive system 306 for positioning the TLA 206 below an arriving carrier to be unloaded, for example. In some embodiments, the position sensor may include several sensors disposed around the circumference of the track 300 and the TLAs 206 may merely include a linear scale that the position sensors detect to determine TLA position. Thus, the position of the TLAs may be determined by either the transfer station 102A or the TLAs themselves.

Figure 8:
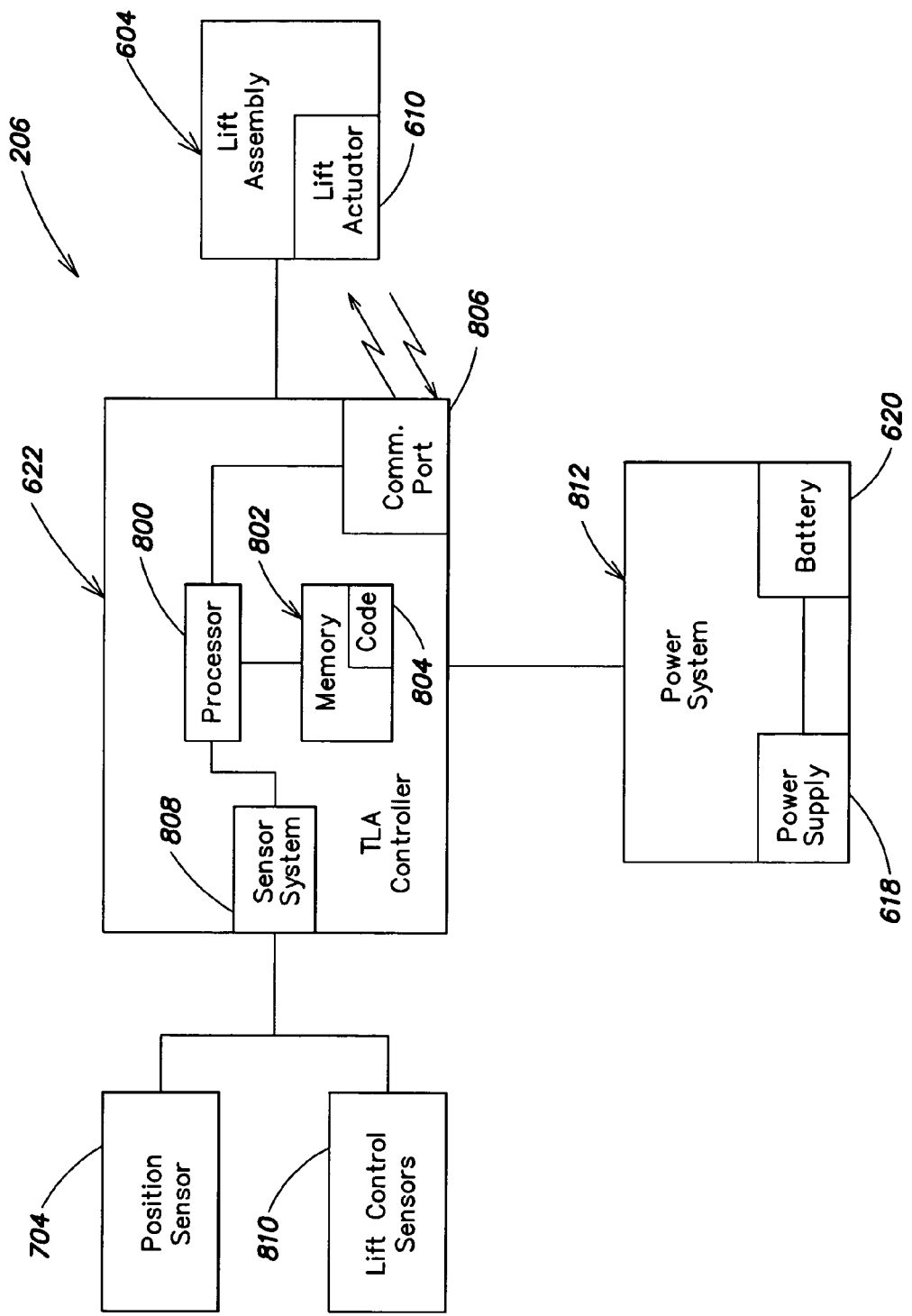
FIG. 8 is a block diagram of components of a transport lift assembly according to embodiments of the present invention.

Turning now to FIG. 8, a block diagram illustrating components of a transport lift assembly 206, and particularly the TLA controller 622, is provided. The TLA controller 622 may include a processor 800, associated memory 802 for storing executable code 804, communications facilities (e.g., a communications port 806), and a sensor system 808 for monitoring various sensors 810, 704 for controlling the TLA 206 and particularly the lift assembly 604. The processor 800 may be any suitable microprocessor or CPU that may be adapted for real time control of the TLA 206. The executable code 804 stored within the memory 802 may include sequences of lift assembly control commands that implement motion profile processes for loading and unloading carriers from conveyors. The communication port 806 may include a transmitter and receiver adapted to wirelessly exchange information with the transfer station controller 308 or other systems using any practicable protocol such as, for example, BLUETOOTH® or wireless Ethernet. Sensors 810, 704 coupled to the sensor system 808 for controlling the lift assembly 604 may include one or more sensors for detecting the position (e.g., up or down) of the lift platform 606, one or more sensors for detecting whether a carrier is currently on the lift platform 606, one or more sensors for determining that the lift platform 606 is centered below a carrier or cradle and ready to unload or load a carrier, and the like.

The TLA controller 622 may also be connected to the lift assembly 604 to actually signal the lift actuator 610 to execute motion profile processes. The TLA controller 622 may also be connected to the power system 812 to receive electrical power from the battery 620 and/or the power supply 618.

Figure 9:
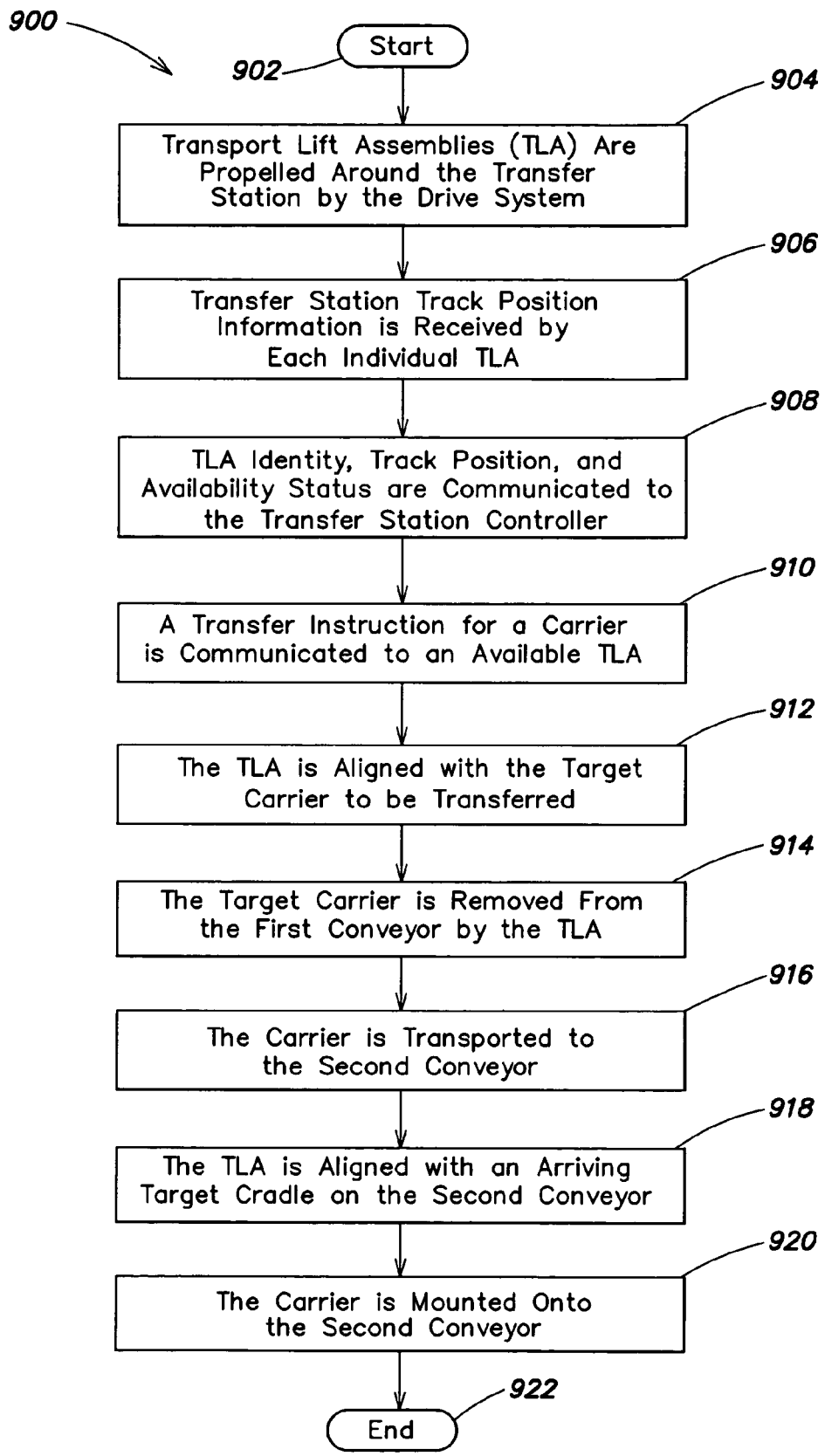
FIG. 9 is a flowchart depicting an example method according to embodiments of the present invention.

Turning to FIG. 9, a flowchart depicting an example method 900 of transferring a carrier from one conveyor to a second conveyor is provided. The method 900 commences at step 902. At step 904, the TLAs 206 are propelled along the transfer station track 300 by the drive system 506. In step 906, transfer station track position information is received by each individual TLA 206 from a respective onboard position sensor 704. In step 908, the TLAs' identity, track position, and availability status are communicated wirelessly to the transfer station controller 308. In step 910, a transfer instruction for a particular target carrier is communicated from the transfer station controller 308 to a particular available TLA 206. In step 912, the TLA 206 is aligned with the target carrier to be transferred that is arriving on the first conveyor. Aligning the TLA 206 with the target carrier may include sensing the position of the arriving carrier using sensor 208 and changing the speed of the TLA 206 to match the speed of the arriving carrier. Changing the speed of the TLA 206 may be affected by the transfer station controller 308 by signaling to the drive system 506 in response to alignment information determined by and received from the TLA 206.

In step 914, the target carrier is removed from the first conveyor by the TLA 206. Removing the carrier may include raising an end effector (e.g., the lift platform 606) of the TLA 206 once the TLA 206 has been aligned with the carrier to be transferred. The lift platform 606 may be raised to contact the carrier and execute an unload motion profile process (described in detail below with respect to FIGS. 10C-D) to disengage the carrier from the moving conveyor.

In step 916, the carrier is transported to the second conveyor. Transporting the carrier includes propelling the TLA 206 around the track 300 of the transfer station 102A via the drive system 506 (e.g., using a linear drive motor 306). In some embodiments, the TLA 206 bearing the carrier may simply circulate on the track 300 until an available cradle arrives, or, in additional or alternative embodiments, the TLA 206 may be instructed to load the carrier back onto the first conveyor to merely relocate the carrier on the first conveyor. This may be done to delay a carrier's arrival at a tool station at another location in the Fab until the tool station is ready for the carrier.

Returning to the method 900 of FIG. 9, in step 918, the TLA is aligned with an arriving (available) target cradle on the second conveyor. The target cradle may be a particular cradle previously identified or it may simply be the next available cradle on the second conveyor to arrive at the transfer station 102A when the TLA 206 is ready to unload. As above, aligning the TLA with the arriving target cradle may include sensing the position of the arriving cradle on the second conveyor and changing the speed of the TLA to match the speed of the arriving cradle.

In step 920, the carrier is mounted onto the second conveyor. Mounting or loading the carrier may include raising the carrier to the target cradle on the second conveyor via the end effector (e.g., the lift platform 606) of the TLA 206 once the TLA 206 has been aligned with the target cradle. A load motion profile process (described in detail below with respect to FIGS. 10A-B) may be executed to engage the carrier on the cradle on the moving conveyor. The method 900 completes at step 922.

Figure 10A:
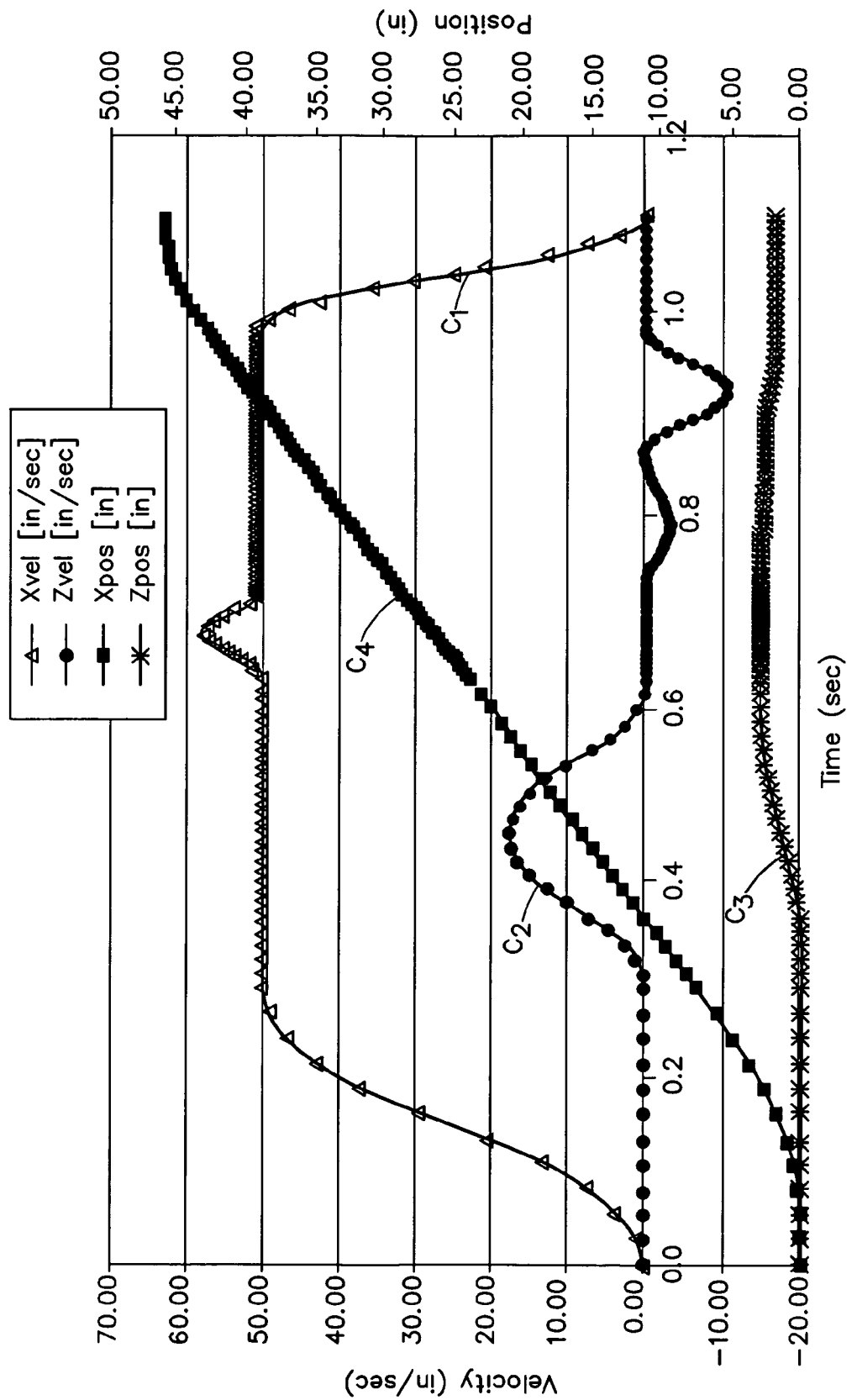
FIG. 10A depicts position and velocity graphs illustrating a carrier loading motion profile process according to embodiments of the present invention.
Figure 10B:
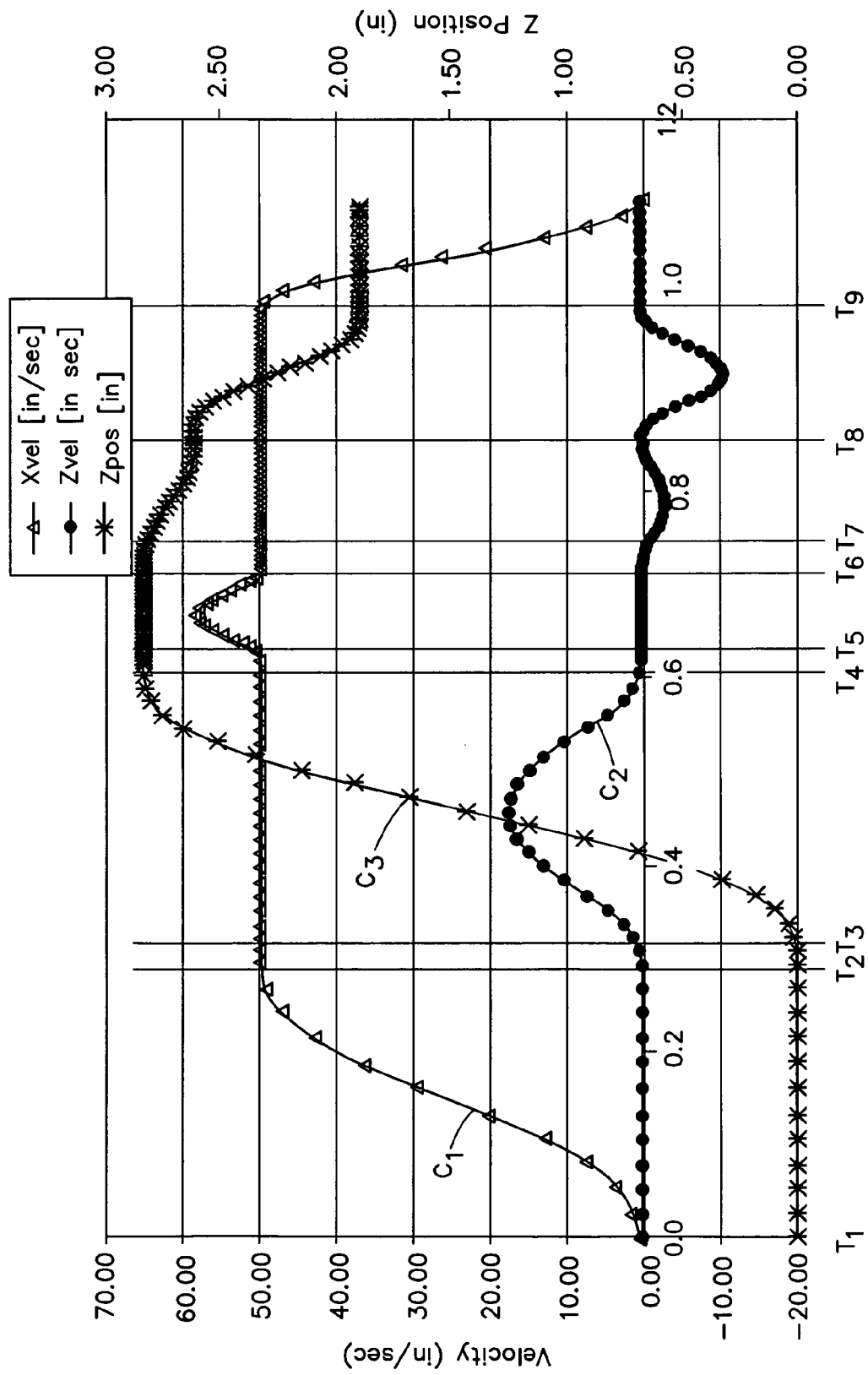
FIG. 10B depicts a more detailed version of some of the position and velocity graphs of FIG. 10A.
Figure 10C:
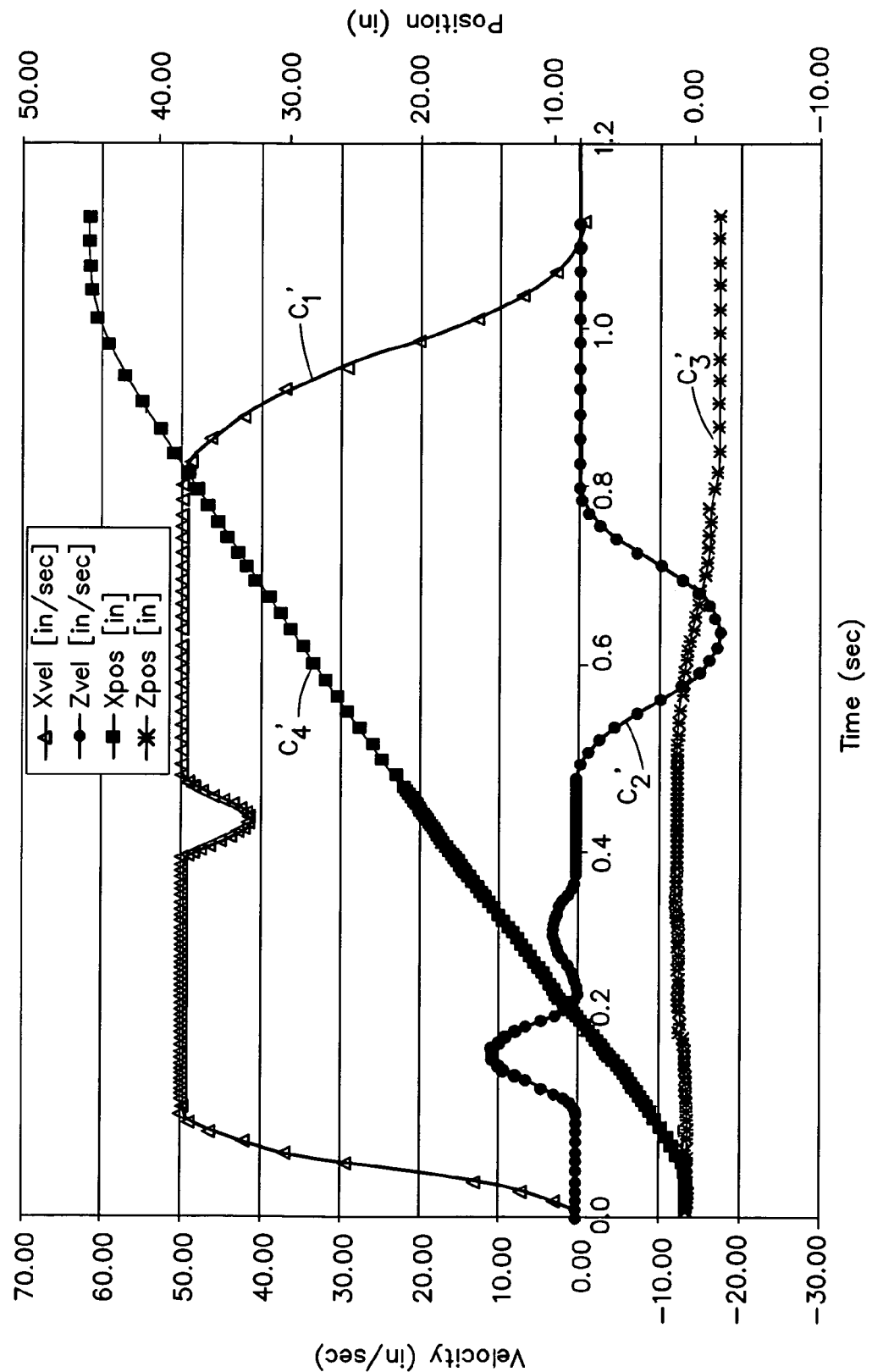
FIG. 10C depicts position and velocity graphs illustrating a carrier unloading process according to embodiments of the present invention.
Figure 10D:
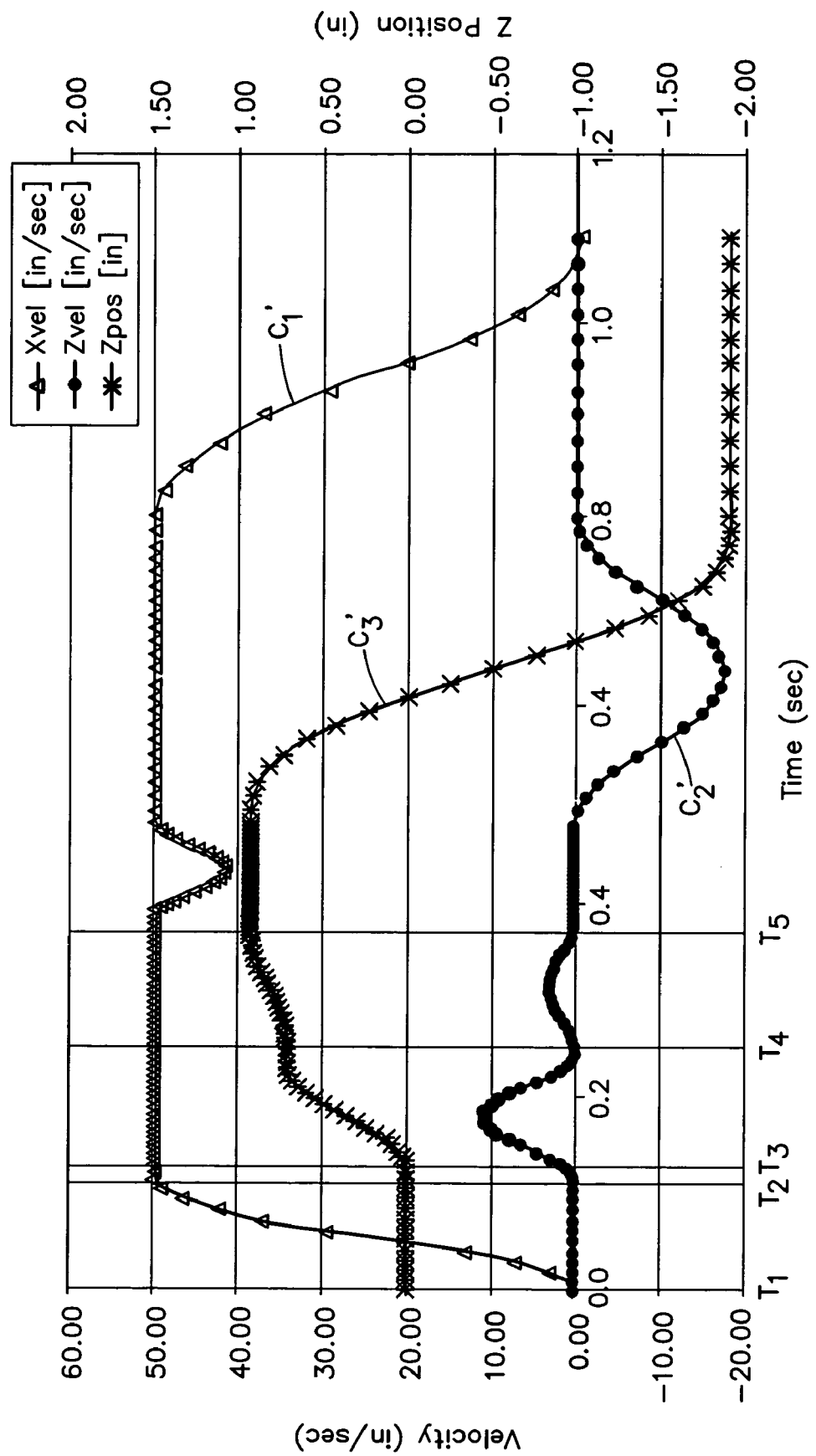
FIG. 10D depicts a more detailed version of some of the position and velocity graphs of FIG. 10C.

FIGS. 10A-D depict exemplary motion profile processes for the lift assembly 604. In at least one embodiment of the invention, when such motion profiles are employed, only the TLA's position sensor 704 need be employed (e.g., the other sensors 208, 810 may be eliminated). With reference to FIG. 10A, curve C1 illustrates lift assembly 604 velocity along the x-axis (horizontal direction in which the conveyor 106A travels) during a load operation. Curve C2 illustrates lift assembly 604 velocity along the z-axis (vertical direction) during a load operation. Curve C3 illustrates lift assembly 604 z-axis position and curve C4 illustrates lift assembly 604 x-axis position during a load operation. FIG. 10B is similar to FIG. 10A, but shows the z-axis position data enlarged. FIGS. 10C-D are similar to FIGS. 10A-B, but illustrate x-axis velocity (curve C1'), z-axis velocity (curve C2'), z-axis position (curve C3') and x-axis position (curve C4') for the lift assembly 604 during an unload operation. Note that FIGS. 10A-B show the z-axis position data (curve C3) at a lower z-position during a start of a substrate carrier load operation (e.g., to compensate for the size of a substrate carrier).

With reference to FIGS. 10A-B and curves C1-C4, the lift assembly 604 may perform similar raisings, lowerings, and accelerations as described above with reference to a load operation. For example, after receiving a signal to perform a load operation, the lift assembly 604 (via the TLA 206) accelerates to match the velocity of the conveyor 106A in the x-direction (curve C1) between times T1 and T2. Thereafter, between times T3 and T4, the lift assembly 604 (curve C3) is raised to the level of the conveyor 106A; for example, such that a flange on the top of the substrate carrier 204 to be loaded onto the conveyor 106A is above the cradle 202 that is to receive the substrate carrier 204.

Between times T5 and T6, the lift assembly 604 is accelerated (curve C1) above the speed of the conveyor 106A (and then is decelerated back to the speed of the conveyor 106A) so that the flange of the substrate carrier 204 is positioned above the cradle 202. At time T7, with the flange of the substrate carrier 204 positioned above the cradle 202, the lift assembly 604 lowers (curve C3) and stops as the flange contacts the cradle 202 (as shown at time T8). The lift assembly 604 then lowers until time T9 and the substrate carrier 204 remains on the cradle 202. The substrate carrier 204 thereby is transferred to the conveyor 106A with substantially zero relative velocity and/or acceleration (e.g., at time T8) between the lift assembly 604 and the cradle 202. For example, because the lift assembly 604 stops as the flange engages the cradle 202, transfer of the substrate carrier 204 occurs with substantially zero velocity and acceleration in the z-direction (curve C2). Likewise, because lift assembly 604 velocity in the x-direction is constant and matched to that of the conveyor 106A during carrier exchange (curve C1), transfer of the substrate carrier 204 occurs with substantially zero acceleration in the x-direction. Further, the only motion occurring in the y-direction during substrate carrier transfer is to accommodate the constant radius of curvature of the transfer station 102A. However, since both the lift assembly 604 and conveyor 106A follow substantially the same path, the relative motion in the y-direction is zero between the lift assembly 604 and conveyor 106A. Accordingly, substrate carrier transfer may be performed with substantially zero relative acceleration in three directions and substantially zero relative velocity in at least two directions. Following time T9, the lift assembly 604 decelerates (curve C1) to the steady state speed of the TLA 206.

With reference to FIGS. 10C-D and curves C1-C4, the lift assembly 604 may perform similar raisings, lowerings, and accelerations as described above with reference to an unload operation. For example, after receiving a signal to perform an unload operation, the lift assembly 604 via the TLA 206 is accelerated to match the velocity of the conveyor 106A in the x-direction (curve C1') between times T1 and T2. Thereafter, between times T3 and T4, the lift assembly 604 is raised (curve C3') so that the kinematic features 626 engage the bottom of the substrate carrier 204 to be unloaded from the conveyor 106A. At time T4, the lift assembly 604 stops raising as the kinematic features 626 engage the bottom of the carrier 204 (curves C2' and C3'). Between times T4 and T5, the lift assembly 604 is raised further so as to lift the flange of the substrate carrier 204 off of the cradle 202. The substrate carrier 204 thereby is unloaded from the cradle 202 with substantially zero relative velocity and/or acceleration (e.g., in the x, y and/or z-directions due to the halting of z-axis motion at time T4 prior to lifting the substrate carrier 204 from the cradle 202 and due to speed matching between the lift assembly 604 and the conveyor 106A). Following time T5, the lift assembly 604 decelerates and reaccelerates (curve C1') and lowers (curve C3') to clear the cradle 202 as previously described and as shown in FIGS. 10C-D.

Accordingly, unloading/loading of substrate carriers from/onto a moving conveyor may occur with substantially zero relative velocity and/or acceleration in one or more directions, more preferably in two directions, and most preferably in all directions. Substantially zero velocity and acceleration in a vertical direction are preferred; and zero velocities and/or accelerations, rather than substantially zero velocities and/or accelerations, during unloading/loading are more preferred. As used herein, "zero velocity" or "zero acceleration" mean as close to zero as possible given system variations such as conveyor height, conveyor speed, actuator repeatability, etc., system limitations such as controller resolution, actuator resolution, TLA position tolerances, etc., and/or the like. "Substantially zero velocity" or "substantially zero acceleration" mean sufficiently close to zero so that a substrate carrier may be unloaded from and/or loaded onto a moving conveyor and/or cradle without damaging a substrate contained within the substrate carrier and/or generating potentially damaging particles. For example, a substrate carrier may be contacted with a relatively small velocity. In one embodiment, a lift assembly may raise vertically rapidly, and then slow down to a relatively small or substantially zero velocity prior to contacting a substrate carrier. A similar small (or substantially zero) acceleration also may be employed. Similar load operations may be performed. In one embodiment, substrates or substrate carriers are contacted in a vertical direction with less than about 0.5 G of force, and in another embodiment with less than about 0.15 G of force. Other contact force values may be employed.

While the present invention has been described primarily with reference to unloading/loading substrate carriers that contain only a single substrate or a small lot carrier from/onto a moving conveyor, it will be understood that substrate carriers that contain multiple substrates similarly may be unloaded from or loaded onto a moving conveyor. Further, the present invention may be employed within systems that transport both single substrate carriers and multiple substrate carriers (e.g., 25 substrate carrier front opening unified pods). Likewise, the present invention may be employed to unload individual substrates from and/or load individual substrates onto a moving conveyor (e.g., substrates that are not contained within a closed substrate carrier). For example, substrates may be transported via a conveyor using an open substrate carrier, a substrate support, a substrate tray or another substrate transport device that allows the lift assembly 604 (or a modified version thereof) to directly place a substrate on or remove a substrate from the substrate transport device of the conveyor using similar lift assembly movements and/or motion profiles. In some embodiments, the transfer station may be located adjacent a storage rack or processing tool station. Individual substrates may be transferred from a conveyor via a transfer station to a docking station or other load port, or directly into a load lock chamber and/or processing tool if desired. For example, a substrate may be transferred directly from the lift assembly 604 to a substrate handling robot of a factory interface and/or processing tool (e.g., via a direct "lift platform-to-end effector" transfer or via an intermediate transfer location). Multiple individual substrates similarly may be unloaded/loaded from/onto a moving conveyor.

The present invention makes it possible to unload individual substrates and/or substrate carriers from a conveyor, to load individual substrates and/or substrate carriers onto a conveyor, and to transfer individual substrates and/or substrate carriers from one conveyor to any number of other conveyors, without stopping the conveyors. Consequently, the conveyors can run continuously during operation of the Fab. These features provide more efficient operation of the Fab, including a reduced total elapsed time for fabricating each substrate, reduced work in progress for a given level of substrate throughput, and a lower manufacturing cost per electronic device produced in the Fab.

As indicated above, the above described system is especially well suited for transporting small lot size carriers, such as substrate carriers that hold a single substrate or substantially fewer than twenty-five substrates (e.g., less than thirteen and in some embodiments, five or less substrates).

In some embodiments of the invention, the above described system may be described as a 'band to band transfer module', hereafter referred to as the B2B transfer module, or just the B2B, may be used to transfer cassettes from one conveyor (also referred to as a 'band'), to another, or to transfer cassettes between two points on the same conveyor at suitable points of close proximity called 'shortcuts'.

Some specific implementation parameters may be adjusted based on whether the system is used as a B2B transfer module or as a shortcut. The velocity of source and destination bands may be slightly different in the in a B2B case, whereas the velocity in a shortcut use is the same for loading and unloading. By imposing a functional requirement to be able to transfer between bands with different velocities, the shortcut case results in a simplified version of the B2B case with a velocity difference of zero.

When the band velocities are approximately the same, or vary so that the average values are similar, there exists a relationship between source and destination cradles (e.g., locations on the conveyor where carriers can be placed). In the B2B case, each cradle location will most likely be part of more than one source-destination cradle pair, due to the different lengths of the two bands. In the shortcut case (i.e., a transfer between two points on the same band) each cradle has one unique cradle in its source-destination cradle pair. This aspect of the implementation may be considered in a scheduling algorithm implementation.

Figure 11:
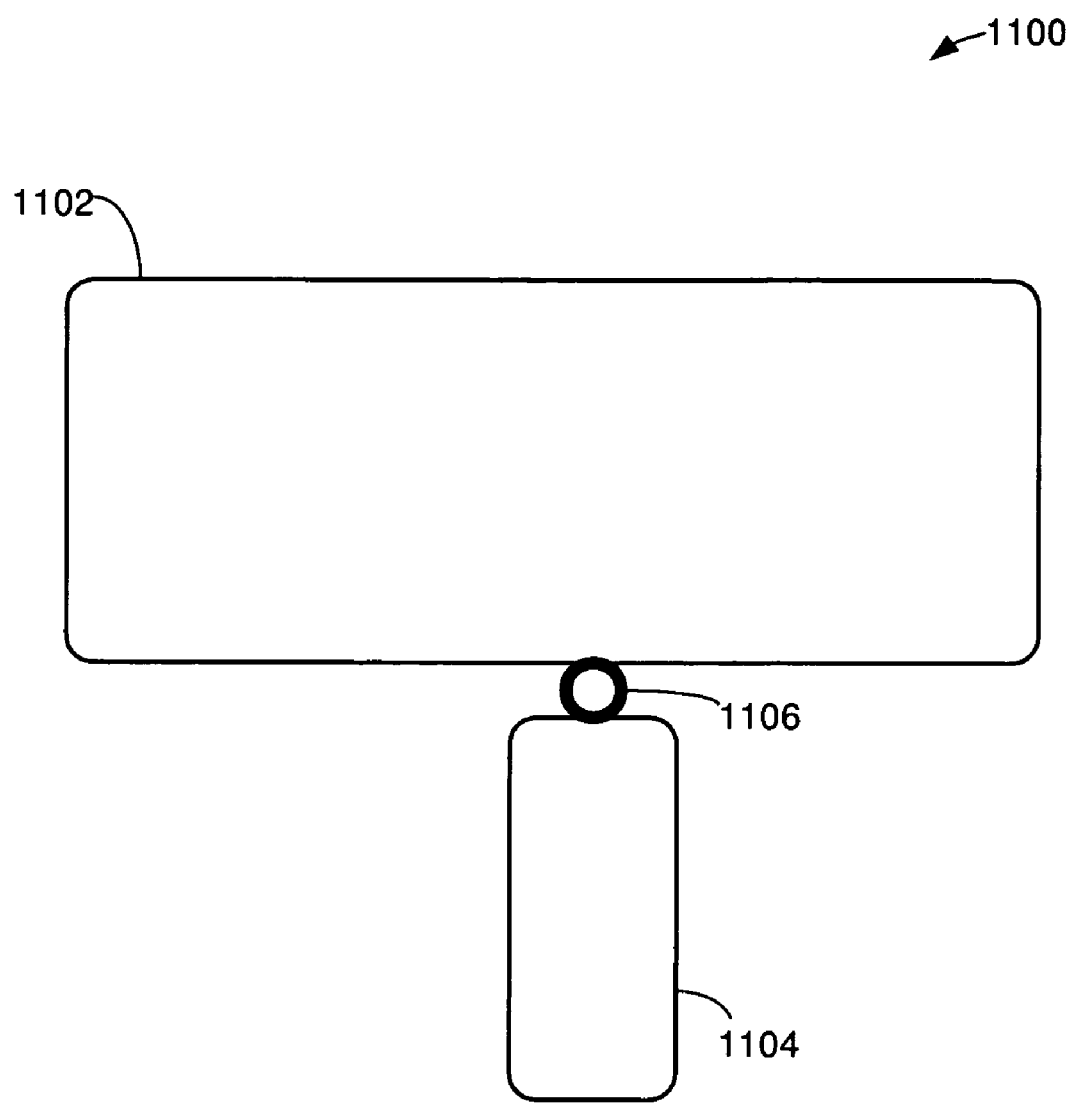
FIG. 11 depicts an example embodiment of two bands bridged by a B2B transfer module according to the present invention.

For example, consider a B2B example embodiment such as depicted in FIG. 11. In the example system 1100, Band1 1102 is approximately 90 meters in length, Band2 1104 is approximately 60 meters in length, and the B2B transfer module 1106 is approximately 2.4 meters in diameter (i.e., approximately 15 meters in circumference). The bands 1102, 1104 both travel at approximately 1.5 meters/second and are bridged by the B2B transfer module 1106 as shown in FIG. 11. If, at time T1, cradle 1 (not shown) of Band1 1102 (B1C1) is approximately 37.5 meters past the location of the B2B transfer module 1106 and cradle 1 (not shown) of Band2 1104 (B2C1) is at the location of the B2B transfer module 1106, after approximately 40 seconds (at time T2), cradle B1C1 will have arrived and B2C1 will be arriving at the B2B transfer module 1106 and may form a B2B transfer pair. Since the B2B transfer module 1106 is also moving carriers at approximately 1.5 meters/second, carriers are scheduled to arrive at the B2B transfer module slightly before (e.g., 5 seconds) the cradles on the (other) band that will ultimately receive the carrier to allow for the transfer time between the bands 1102, 1104. At approximately 1.5 meters/second it takes approximately 5 seconds to transfer a carrier over the approximately 7.5 meters (half the circumference) of the example B2B transfer module 1106. Thus, in the above example, the carrier on the B1C1 cradle is handed off to the B2B transfer module 1106 at approximately 5 seconds before time T2 and by time T2, the B2B transfer module 1106 has moved the carrier to meet the arriving B2C1 cradle for a hand off.

Figure 12:
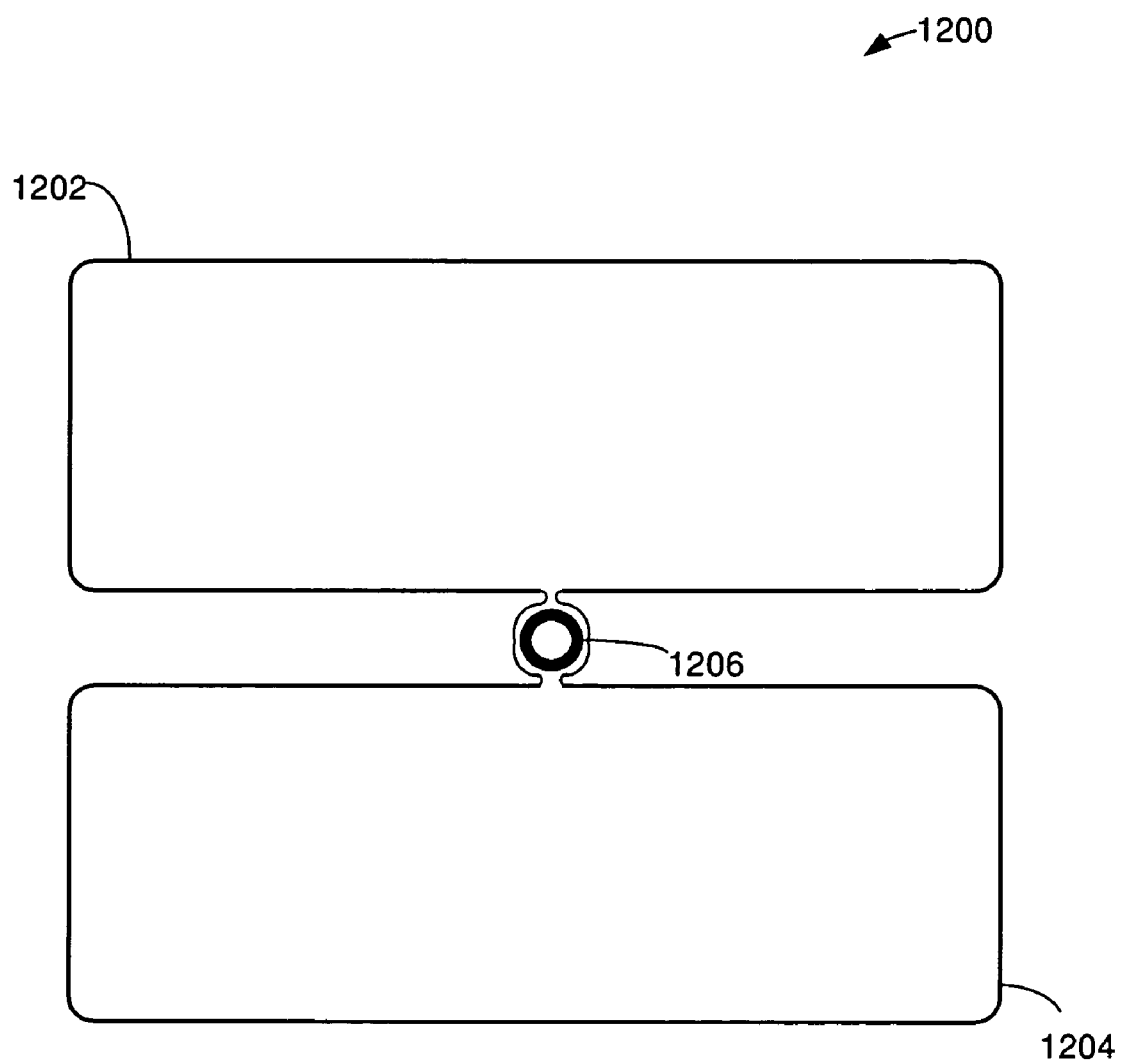
FIG. 12 depicts an example embodiment of two segments of a single band bridged by a B2B transfer module to form a "shortcut" according to the present invention.

In the case of an implementation 1200 where transfers occur within the same band as depicted in FIG. 12, the source-destination cradle pairs may be determined purely based upon a function of the lengths of the segments 1202, 1204 between the B2B transfer module 1206.

In some embodiments, a B2B transfer module may included seven moving TLAs, which are in constant motion at the nominal velocity of the conveyor/s along the B2B transfer module's track (e.g., a circular track) which may be approximately 8 feet or 2.4 meters in diameter. In other embodiments more or fewer cars may be used and larger or smaller tracks may be used.

In an example embodiment, the nominal spacing of the TLAs may be 1 meter, e.g., twice the spacing of cradles on a band. Thus, in this example embodiment, adjacent TLAs may access alternate (every other) cradle on a band. The bands (or band segments) at the B2B transfer point move in opposite directions. Each TLA is capable of being independently controlled along the track axis. In other words, each of the TLA's speed, position, load function, unload functions, etc. may be separately controlled. Each TLA includes an independent vertical axis. Each TLA may have similar operational capabilities as a toolstation robot in that, as described above, the track axis and the vertical axis may be moved together to perform 'pick' and 'place' load/unload motion profiles to perform carrier transfers.

Figure 13:
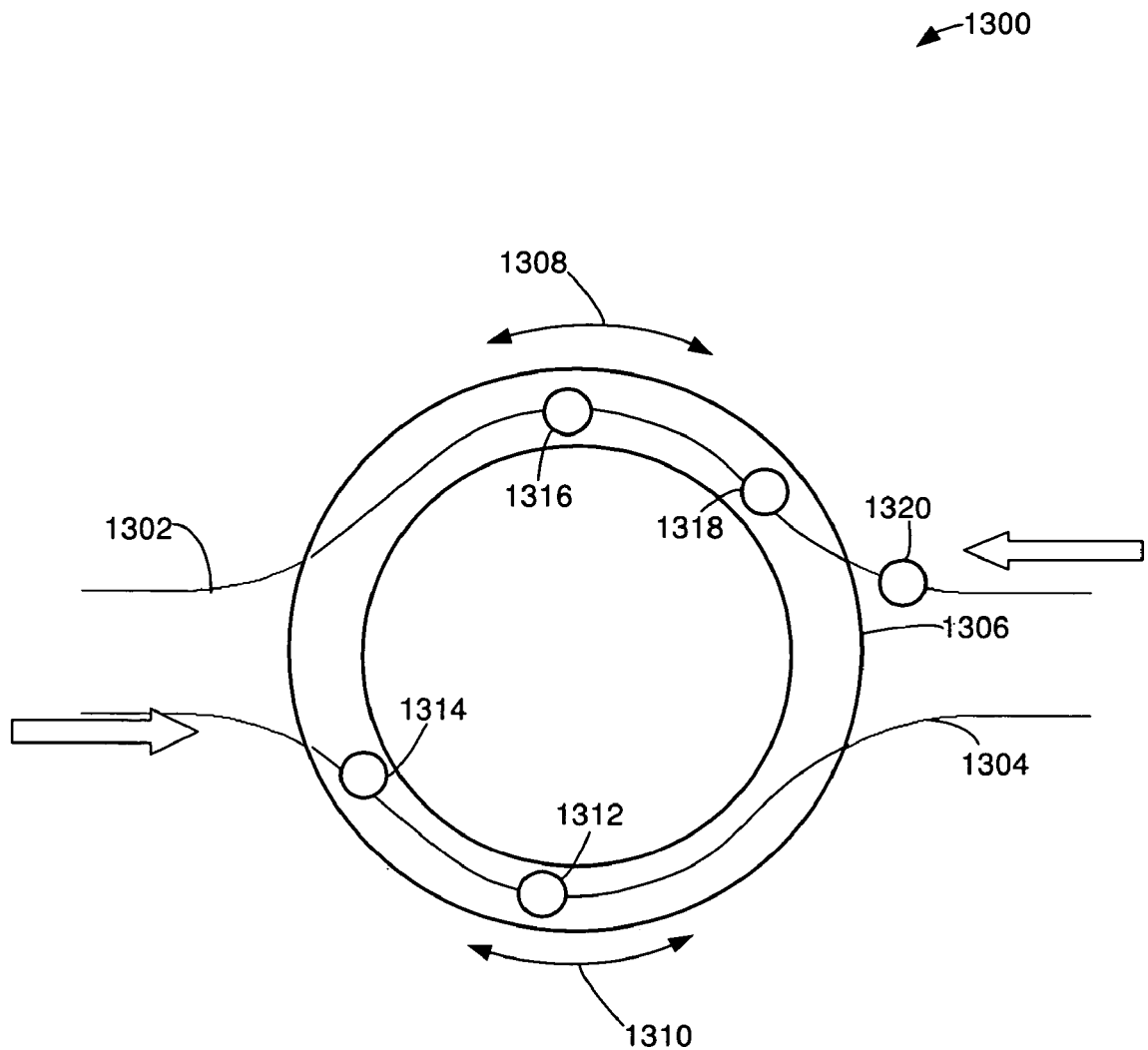
FIG. 13 depicts a schematic representation of an example embodiment of a B2B transfer module with transfer zones according to the present invention.

Turning to FIG. 13, a schematic representation of an example embodiment of a B2B transfer module 1300 is depicted. Band1 1302, which is disposed above the B2B transfer module 1300, moves in a right to left direction and Band2 1304, which is also disposed above the B2B transfer module 1300, moves in a left to right direction. In the particular example embodiment depicted, the track 1306 includes TLAs (not shown) that circulate around the track in a counter-clockwise direction. In other embodiments, the bands 1302, 1304 and TLAs may move in other directions than those of FIG. 13. At any given time, there is a length along each band 1302, 1304 (or band section) which is in a "transfer zone" 1308, 1310. Carriers 1312, 1314 and 1316, 1318, 1320 are brought to the respective transfer zones 1310, 1308 wherein TLAs may remove the carriers 1312, 1316 in the transfer zones 1310, 1308 from their respective cradles (not shown). Likewise, the TLAs may load carriers 1312, 1316 in the transfer zones 1310, 1308 onto cradles also within the respective transfer zones 1310, 1308.

Assuming 100% availability of source carriers (on source cradles) and destination cradles, the maximum theoretical throughput of the B2B transfer module may be expressed as a function of band velocity and cradle spacing. For example, assuming a nominal band velocity of 2 meters/second, 0.5 meter cradle spacing, and a 1 meter TLA spacing, the B2B transfer module can pick 2 cradles and place 2 cradles every second. Thus for the 'every-other' embodiment described above, the maximum theoretical throughput ($T_M$) of such a B2B transfer module is:

=2(cradles/sec@2 m/s velocity)*60 sec/min*60 min/hr

=7200 picks and places per hour (e.g., two TLAs approximately concurrently loading/unloading from/to each band)

Since the B2B cars can have independent control along the track axis, the bands 1302, 1304 do not need to be started or stopped in phase with each other with a high degree of accuracy. The length of travel between the transfer zones 1308, 1310 for the two bands 1302, 1304 may be used to 'speed up' or 'lag behind', to accommodate any 'out of phase' characteristics of the two bands. Such characteristics may result from a time gap between starting of each of the two bands 1302, 1304 and/or a constant phase shift that results from a velocity difference between the two bands 1302, 1304.

In some embodiments, based on any velocity difference between the two bands 1302, 1304, a reservation model may be employed, where the lagging or/and trailing cradles on a destination band are reserved to ensure handoffs. The B2B transfer module 1300 may incorporate functionality to "speed up to catch next cradle." This may be useful if the scheduled cradle for a handoff is not available for any reason and the adjacent cradle is available for use. Similarly, the B2B transfer module 1300 may incorporate functionality to "slow down to catch next cradle."

In some embodiments, the B2B transfer module 1300 may perform velocity measurements on the bands 1302, 1304 with which the B2B transfer module 1300 interfaces, and may provide scheduling updates. In the case of a missed handoff to a destination cradle, a carrier may be transported around the B2B transfer module 1300 until a next destination cradle is identified. This may indicate an anomaly condition in some embodiments.

In some embodiments, the TLAs may incorporate suitable design features (e.g., redundant drive and/or transfer systems) to ensure that the bands continue to operate in case of one or more TLA failures in any operational position.

In some embodiments, several factors and operating parameters may influence the use and implementation considerations of a B2B transfer module. Overall or specific transfer time requirements, if available in advance, may dictate an optimal toolset layout, which may be used in turn to minimize the need for a B2B transfer module. In such cases, a single band may satisfy transfer time requirements and thus, using a single band, transfers may not be required between bands. In such cases, a B2B transfer module in a "shortcut" configuration, as depicted in FIG. 12, may still be useful to improve throughput, or otherwise, between two or more points within the same band.

Expansion of an existing Fab typically entails inclusion of additional areas and tools. Any future plans for expansion, if available, may be considered while planning band and B2B transfer module layouts. Further, in cases where tools are distributed within a FAB after considering transfer time requirements, and necessary proximity considerations are met, process step and metrology changes may introduce long transfer time paths. Thus, the possibility of process step and metrology changes may be important considerations in planning band and B2B transfer module layouts.

The foregoing description discloses only particular embodiments of the invention; modifications of the above disclosed methods and apparatus which fall within the scope of the invention will be readily apparent to those of ordinary skill in the art. It will be understood that the invention may be employed with any type of substrates such as a silicon substrate, a glass plate, a mask, a reticule, etc., whether patterned or unpatterned; and/or with apparatus for transporting and/or processing such substrates.

Accordingly, while the present invention has been disclosed in connection with specific embodiments thereof, it should be understood that other embodiments may fall within the spirit and scope of the invention, as defined by the following claims.

The invention claimed is:

1. A band to band transfer apparatus comprising:
   a first assembly adapted to remove a substrate carrier which is adapted to transport substrates for manufacture of electronic devices from a source conveyor traveling at a first speed while a portion of the source conveyor is in motion within a first transfer zone of a closed-loop transfer station track of the band to band transfer apparatus; and
   a second assembly adapted to load a substrate carrier which is adapted to transport substrates for manufacture of electronic devices onto a destination conveyor traveling at a second speed while a portion of the destination conveyor is in motion within a second transfer zone of the transfer station track of the band to band transfer apparatus and wherein each of the first assembly and second assembly are adapted to support the substrate carrier and change speed while circulating around on a surface of the closed-loop transfer station track.

2. The apparatus of claim 1 wherein the first assembly and the second assembly are a single, same assembly.

3. The apparatus of claim 1 wherein the source conveyor and the destination conveyor are different portions of a single, same conveyor.

4. The apparatus of claim 1 wherein the substrate carrier is a lot size carrier adapted to hold a maximum of less than thirteen substrates.

5. The apparatus of claim 1 wherein the substrate carrier from the source conveyor is supported on the source conveyor by a first cradle,
   wherein the substrate carrier loaded onto the destination conveyor is supported on the destination conveyor by a second cradle, and
   wherein the first cradle is paired with the second cradle by a scheduler executing in a system controller.

6. The apparatus of claim 5 wherein a speed of the first assembly is adjusted to match a speed of the source conveyor in the first transfer zone of the band to band transfer apparatus.

7. The apparatus of claim 5 wherein a speed of the second assembly is adjusted to match a speed of the destination conveyor in the second transfer zone of the band to band transfer apparatus.

8. A system for transporting substrate carriers, the system comprising:
- a first conveyor traveling at a first speed;
- a second conveyor traveling at a second speed; and
- a band to band transfer apparatus disposed adjacent the first and second conveyors and including:
    - a first assembly adapted to remove a substrate carrier which is adapted to transport substrates for manufacture of electronic devices from the first conveyor while a portion of the first conveyor is in motion within a first transfer zone of the band to band transfer apparatus, and
    - a second assembly adapted to load a substrate carrier which is adapted to transport substrates for manufacture of electronic devices onto the second conveyor while a portion of the second conveyor is in motion within a second transfer zone of the band transfer apparatus wherein the first and second assemblies support the substrate carrier while circulating around on a surface of the closed-loop transfer station track of the band transfer apparatus and wherein each of the first assembly and the second assembly are adapted to change speed while circulating around on the surface of the closed-loop transfer station track.

9. The system of claim 8 wherein the first assembly and the second assembly are a single, same assembly.

10. The system of claim 8 wherein the first conveyor and the second conveyor are different portions of a single, same conveyor.

11. The system of claim 8 wherein the substrate carrier is a lot size carrier adapted to hold a maximum of less than thirteen substrates.

12. The system of claim 8 further comprising a system controller coupled to the band to band transfer apparatus,
- wherein the substrate carrier from the first conveyor is supported on the first conveyor by a first cradle,
- wherein the substrate carrier loaded onto the second conveyor is supported on the second conveyor by a second cradle, and
- wherein the first cradle is paired with the second cradle by a scheduler executing in the system controller.

13. The system of claim 12 wherein a speed of the first assembly is adjusted to match a speed of the first conveyor in the first transfer zone of the band to band transfer apparatus.

14. The system of claim 12 wherein a speed of the second assembly is adjusted to match a speed of the second conveyor in the second transfer zone of the band to band transfer apparatus.

15. A method of transporting substrate carriers using a band to band transfer apparatus, the method comprising:
- removing a substrate carrier which is adapted to transport substrates for manufacture of electronic devices from a source conveyor traveling at a first speed while a portion of the source conveyor is in motion within a first transfer zone of the band to band transfer apparatus;
- conveying the substrate carrier from the first transfer zone to a second transfer zone on an assembly supporting the substrate carrier while circulating around on a surface of a closed-loop transfer station track of the band to band transfer apparatus; and
- loading the substrate carrier onto a destination conveyor traveling at a second speed while a portion of the destination conveyor is in motion within the second transfer zone of the band to band transfer apparatus wherein during each of the steps of removing and loading, the assembly is adapted to change speed in the first and second transfer zones while circulating around on the surface of a closed-loop transfer station track.

16. The method of claim 15 wherein the removing the substrate carrier and the loading the substrate carrier are performed by a single, same assembly.

17. The method of claim 15 wherein the source conveyor and the destination conveyor are different portions of a single, same conveyor.

18. The method of claim 15 wherein the substrate carrier is a lot size carrier adapted to hold a maximum of less than thirteen substrates.

19. The method of claim 15 wherein the substrate carrier from the source conveyor is supported on the source conveyor by a first cradle,
- wherein the substrate carrier loaded onto the destination conveyor is supported on the destination conveyor by a second cradle, and
- wherein the first cradle is paired with the second cradle by a scheduler executing in a system controller.

20. The method of claim 19 wherein a speed of a first assembly used to remove the substrate carrier is adjusted to match a speed of the source conveyor in the first transfer zone of the band to band transfer apparatus.

21. The method of claim 19 wherein a speed of a second assembly used to load the substrate carrier is adjusted to match a speed of the destination conveyor in the second transfer zone of the band to band transfer apparatus.

* * * * *